United States Patent [19]
Dreyer

[11] Patent Number: 5,740,213
[45] Date of Patent: Apr. 14, 1998

[54] DIFFERENTIAL CHARGE PUMP BASED PHASE LOCKED LOOP OR DELAY LOCKED LOOP

[76] Inventor: Stephen F. Dreyer, P.O. Box 60323, Sunnyvale, Calif. 94086

[21] Appl. No.: 253,537

[22] Filed: Jun. 3, 1994

[51] Int. Cl.$^6$ .............................. H03D 3/24; H04L 23/60
[52] U.S. Cl. .................. 375/374; 331/17; 327/157
[58] Field of Search .................... 375/120, 371, 375/374, 375, 376; 331/1 A, 25, 1 R, 4, 14, 17, 18; 327/156, 157, 158, 159, 160, 161, 162, 148

[56] References Cited

U.S. PATENT DOCUMENTS

| | | | |
|---|---|---|---|
| 4,414,479 | 11/1983 | Foley | 307/253 |
| 4,808,858 | 2/1989 | Stoops | 307/544 |
| 4,959,618 | 9/1990 | Shier | 328/155 |
| 5,196,980 | 3/1993 | Carson | 361/18 |
| 5,432,477 | 7/1995 | Nishiyama et al. | 330/254 |

OTHER PUBLICATIONS

Robert R. Cordell et al., "A 50 MHz Phase-and Frequency-Locked Loop," IEEE Journal of Solid-State Circuits, vol. SC-14, No. 6, Dec. 1979, pp. 1003-1009.

Mel Bazes, "A Novel Precision MOS Synchronous Delay Line," IEEE Journal of Solid-State Circuits, vol. SC-20, No. 6, Dec. 1985, pp. 1265-1271.

Mel Bazes et al., "A Novel CMOS Digital Clock and Data Decoder," IEEE Journal of Solid-State Circuits, vol. 27, No. 12, Dec. 1992, pp. 1934-1940.

Sam Yinshang Sun, "An Analog PLL-Based Clock and Data Recovery Circuit with High Input Jitter Tolerance," IEEE Journal of Solid-State Circuits, vol. 24, No. 2, Apr. 1989, pp. 325-330.

Floyd M. Gardner, "Charge-Pump Phase-Lock Loops," IEEE Transactions on Communications, vol. COM-28, No. 11, Nov. 1980, pp. 1849-1858.

Deog-Kyoon Jeong et al., "Design of PLL-Based Clock Generation Circuits," IEEE Journal of Solid-State Circuits, vol. SC-22, No. 2, Apr. 1987, pp. 255-261.

Ian A. Young et al., "A PLL Clock Generator with 5 to 110 MHz of Lock Range for Microprocessors," IEEE Journal of Solid-State Circuits, vol. 27, No. 11, Nov. 1992, pp. 1599-1607.

Mark G. Johnson, "A Variable Delay Line PLL for CPU-Coprocessor Synchronization," IEEE Journal of Solid-State Circuits, vol. 23, No. 5, Oct. 1988, pp. 1218-1223.

*Primary Examiner*—Curtis Kuntz
*Assistant Examiner*—Paul Loomis
*Attorney, Agent, or Firm*—Skjerven, Morrill, MacPherson, Franklin & Friel

[57] ABSTRACT

A phase locked loop includes a differential charge pump to cancel static phase error and reduce sensitivity to noise. The differential charge pump comprises two substantially identical single-ended charge pumps so that under locked condition, changes in voltage at the charge pumps' output terminals are substantially identical, thereby maintaining a substantially constant difference between the charge pumps' output voltage. A differential input voltage-controlled oscillator receives the output of the differential charge pump and generates a clock signal with a frequency proportional to the voltage difference output by the differential charge pump. A common mode bias circuit adjusts the common mode voltage output by the differential charge pump to optimize the voltage swing available at the differential charge pump's output terminals. The structure can be easily modified to implement a delay locked loop by replacing the differential input voltage-controlled oscillator with a differential input voltage-controlled delay circuit.

24 Claims, 16 Drawing Sheets

DIFFERENTIAL CHARGE PUMP BASED PHASE LOCKED LOOP OR DELAY LOCKED LOOP

FIELD OF THE INVENTION

This invention relates to phase locked loop and delay locked loop circuits, and more particularly, to phase locked loop and delay locked loop circuits incorporating differential charge pump circuits.

BACKGROUND INFORMATION

Phase locked loops and delay locked loops are routinely used for data communications, frequency synthesis, clock generation, clock recovery, and similar applications. Phase locked loops and delay locked loops are often implemented in integrated circuits and commonly are realized with charge pump techniques.

FIG. 1 shows a block diagram of a typical charge pump based phase locked loop 1. Phase locked loop 1 comprises a phase detector 4, a charge pump 5, a loop filter 7, and a voltage-controlled oscillator 9. Phase locked loop 1 operates to align clock signals in both frequency and phase.

FIG. 2 shows a block diagram of a typical phase detector 4. Phase detector 4 receives two clock signals CLKI and CLKO at terminals 11 and 12 to generate an output pulse on terminal 14 when clock signal CLKI leads clock signal CLKO, and on terminal 15 when clock signal CLKI lags clock signal CLKO.

Phase detector 4 comprises a D flip flop 25, a D flip flop 27, an AND gate 29, a delay block 31 and a delay block 33. D flip flops 25 and 27 are falling edge triggered flip-flops having their D input terminals connected to a logic one voltage level. As a result, at every falling edge on their clock terminals, the D flip flops generate a logic one output signal at their Q output terminals 26 and 28. AND gate 29 resets D flip flops 25 and 27 when the voltages on Q output terminals 26 and 28 are both at a logic one level.

FIG. 2A shows a timing diagram of various voltages within phase detector 4 while in operation. In this example, clock signal CLKI, illustrated by a waveform 36, leads clock signal CLKO, illustrated by a waveform 37. The voltage on Q output terminal 26 rises to a logic one at time $t_1$ when clock signal CLKI has a falling edge. The voltage at output terminal 14 rises to a logic one after a small delay, $\Delta t$, as illustrated by waveform 38. The voltage on Q output terminal 28 rises to a logic one at time $t_2$, which resets D flip flops 25 and 27. The voltage at output terminal 14 then falls to a logic zero after a small delay of $\Delta t$ from the falling edge of clock signal CLKO. Thus, an output pulse width equal to the phase difference between the falling edges of clock signals CLKI and CLKO is transmitted on output terminal 14 as illustrated by waveform 38. The delay blocks 31 and 33 have a filtering effect that filters out pulses having pulse widths smaller than a minimum pulse width. Because delay block 33 filters out the small pulse generated on Q output node 28 just before the D flip flops 25 and 26 are reset by AND gate 29, no pulse is transmitted on output terminal 15, as illustrated by waveform 39.

Referring back to FIG. 1, charge pump 5 receives the signals at terminals 14 and 15 at its corresponding terminals 16 and 17. Charge pump 5 controls the voltage $V_{CP}$ at an output terminal 18 by adding charge to output terminal 18, as long as it detects a pulse on terminal 16, and removing charge from output terminal 18, as long as it detects a pulse on terminal 17. To add and remove charge from output terminal 18, a conventional charge pump provides both a charging current source and a discharging current source. Thus, voltage $V_{CP}$ at output terminal 18 increases when clock signal CLKI leads clock signal CLKO and decreases when clock signal CLKI lags clock signal CLKO.

Loop filter 7 is coupled at its input terminal 19 to output terminal 18 of charge pump 5. Loop filter 7 stabilizes the loop. Voltage-controlled oscillator 9 generates an oscillating output signal at CLKOUT terminal 13 whose frequency is proportional to the voltage at input terminal 20. Thus, when clock signal CLKI leads clock signal CLKO, voltage $V_{CP}$ increases as described above, which in turn causes voltage-controlled oscillator 9 to increase the frequency of clock signal CLKO. Conversely, when clock signal CLKI lags clock signal CLKO, voltage $V_{CP}$ decreases, which causes voltage-controlled oscillator 9 to decrease the frequency of clock signal CLKO. The feedback circuit of FIG. 1 thus constantly attempts to align clock signal CLKO with clock signal CLKI in frequency and phase. When the loop is substantially stabilized, clock signals CLKI and CLKO are aligned in frequency and phase and phase locked loop 1 is in the "locked" condition.

A delay locked loop operates in a similar manner to a phase locked loop except that the voltage controlled oscillator is replaced with a voltage controlled delay line. The voltage controlled delay line receives clock signal CLKI and generates clock signal CLKO. The loop adjusts the delay in voltage controlled delay line until clock signals CLKI and CLKO are aligned in phase, which is the stabilized or locked condition.

Charge pump based phase locked loops and delay locked loops have some performance limitations. One such limitation is termed "static phase error". A static phase error is any phase error that exists between clock signals CLKI and CLKO under locked condition. Ideally, under locked condition, no static phase error should exist. However, in practice, circuit imperfections exist which cause a static phase error.

One source of static phase error is phase detector 4. Delay blocks 31 and 33 filter out pulses smaller than the minimum pulse width. Thus, phase differences between CLKI and CLKO must be greater than the minimum pulse width before an output pulse is provided in either output terminal 14 or output terminal 15. Phase errors smaller than the minimum pulse cannot be resolved, thus resulting in static phase error.

Another source of static phase error is the leakage current at output terminal 18 of charge pump 5 which causes changes in voltage $V_{CP}$. Ideally, phase detector 4 does not generate any pulse on terminals 14 or 15 under locked condition. However, in practice, leakage current at output terminal 18 charges or discharges voltage $V_{CP}$ over time. As a result of the increase or decrease in voltage $V_{CP}$, the action of phase locked loop 1 causes a change in the phase of clock signal CLKO. In the steady state, a static phase difference between clock signals CLKI and CLKO is introduced to cause charge pump 5 to substantially counteract effects of the leakage current at output terminal 18.

In some implementations, phase detector 4 generates a minimum pulse on each of terminals 14 and 15 of phase detector 4 to compensate for leakage currents in both the charging and discharging current sources in charge pump 5 when phase locked loop 1 is under locked condition. However, although minimum pulses on each of the terminals 14 and 15 compensate to some degree for the leakage current problem, at least four sources of static phase error result.

A first source of static phase error is unequal charge pump current sources. As mentioned above, charge pumps typically use a charging current source to charge output terminal 18 and a discharging current source to discharge output terminal 18. The charging current source and discharging current source are rarely exactly matched because of physical limitations. Thus, when a minimum pulse is forced on each of input terminals 16 and 17 of charge pump 5 under a locked condition, charge will be added or removed from output terminal 18 because the charging and discharging currents are not equal. This change in the charge at output terminal 18 causes a change in the voltage $V_{CP}$, which in turn causes phase locked loop 1 to change the phase of clock signal CLKO thereby introducing a static phase error.

A second source of static phase error is unequal switching times. The charging and discharging current sources are selectably coupled to output terminal 18 by switches, which are invariably less than ideal. Switches for the charging and discharging current sources do not have identical switching times because of differences in type, sizes, bias conditions, drive, driver rise time and driver fall time, and other parametric values. Because the switching times of these switches are not identical, the charge transferred between the charging and discharging current sources and terminal 18 are not equal. Thus, charge will be added or removed from output terminal 18 when phase detector 4 forces the minimum pulse on input terminal 16 and input terminal 17 during lock. This change in the charge at output terminal 18 causes a change in voltage $V_{CP}$, which in turn causes phase locked loop 1 to change the phase of clock signal CLKO, thereby introducing static phase error.

A third source of static phase error is charge injection from the switches in charge pump 5. Typically, the switches in charge pump 5 are implemented with field effect transistors. Field effect transistors have significant capacitance between each pair of the gate, the source, and the drain terminals. As a result, when the switches become conductive and non-conductive, these switches couple charge into output terminal 18. Because these switches are not identical, each switch will inject a different amount of charge into output terminal 18. This change in charge at output terminal 18 causes a change in voltage $V_{CP}$, which in turn causes a change in the phase of clock signal CLKO, thereby introducing static phase error.

A fourth source of static phase error is the ineffectiveness of this compensation scheme. Despite generating a minimum pulse on both input terminal 16 and input terminal 17, the effect of leakage currents may still be present in the resulting circuit thereby causing static phase error as described above.

Another limitation of charge pump based circuits is sensitivity to any noise added to voltage $V_{CP}$. Because voltage $V_{CP}$ controls the phase of clock signal CLKO, any noise added to voltage $V_{CP}$ will cause phase and frequency disturbances ("jitters") in clock signal CLKO. In many phase locked loop designs, clock signal CLKO is very sensitive to noise because the frequency of clock signal CLKO is designed to vary by a relatively large amount for a small change in voltage $V_{CP}$.

Loop filter 7 may be one source of noise on voltage $V_{CP}$. A typical loop filter design includes a resistor connected to terminal 19 in series with a capacitor between terminal 19 and GROUND. As stated above, phase detector 4 generates a minimum pulse on each of the charge pump's input terminals 16 and 17. As a result, charge pump 5 adds charge to output terminal 18, and the resistor of loop filter 7 causes an immediate voltage increase on voltage $V_{CP}$ equal to the product of the resistor value and the current. The voltage increase ceases when the charge on the capacitor reaches the desired change in voltage $V_{CP}$. The voltage increase described above is a transient noise of short duration because charge pump 5 only adds charge for a short duration; nonetheless, this momentary voltage jump causes a momentary change in the frequency of clock signal CLKO, thus causing jitter.

Other noise sources include noisy power supplies, cross coupling of signals on nearby conductors, and varying current demand.

SUMMARY OF THE INVENTION

In accordance with one embodiment of the present invention, a phase locked loop is provided. The phase locked loop includes a differential charge pump to cancel static phase error and reduce sensitivity to noise. The differential charge pump comprises two substantially identical single-ended charge pumps so that, under locked condition, changes in voltage at the charge pumps' output terminals are substantially identical, thereby maintaining a substantially constant difference between the charge pumps' output voltages. In accordance with one embodiment of the present invention, a differential input voltage-controlled oscillator monitors the output of the differential charge pump and generates a clock signal having a frequency proportional to the output differential voltage of the differential charge pump. A common mode bias circuit adjusts the common mode voltage output of the differential charge pump to optimize the voltage swing available at the differential charge pump's output terminals.

In accordance with another embodiment of the present invention, a delay locked loop is provided. The structure is similar to one embodiment of the differential phase locked loop described above, except a differential voltage-controlled delay circuit is included in the delay locked loop instead of a voltage-controlled oscillator. The delay locked loop includes a differential charge pump to cancel static phase errors and reduce sensitivity to noise.

DETAILED DESCRIPTION OF THE INVENTION

Figure 1:
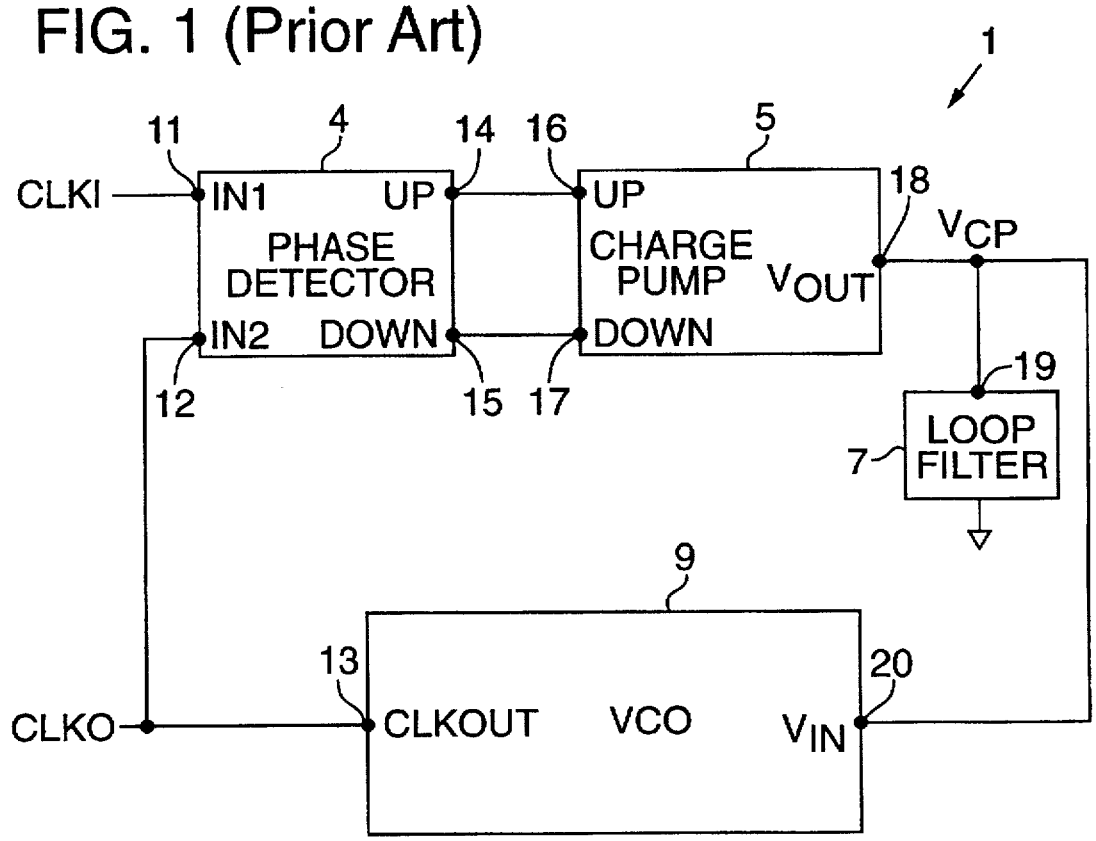
FIG. 1 shows a block diagram of a typical charge pump based phase locked loop 1.
Figure 2:
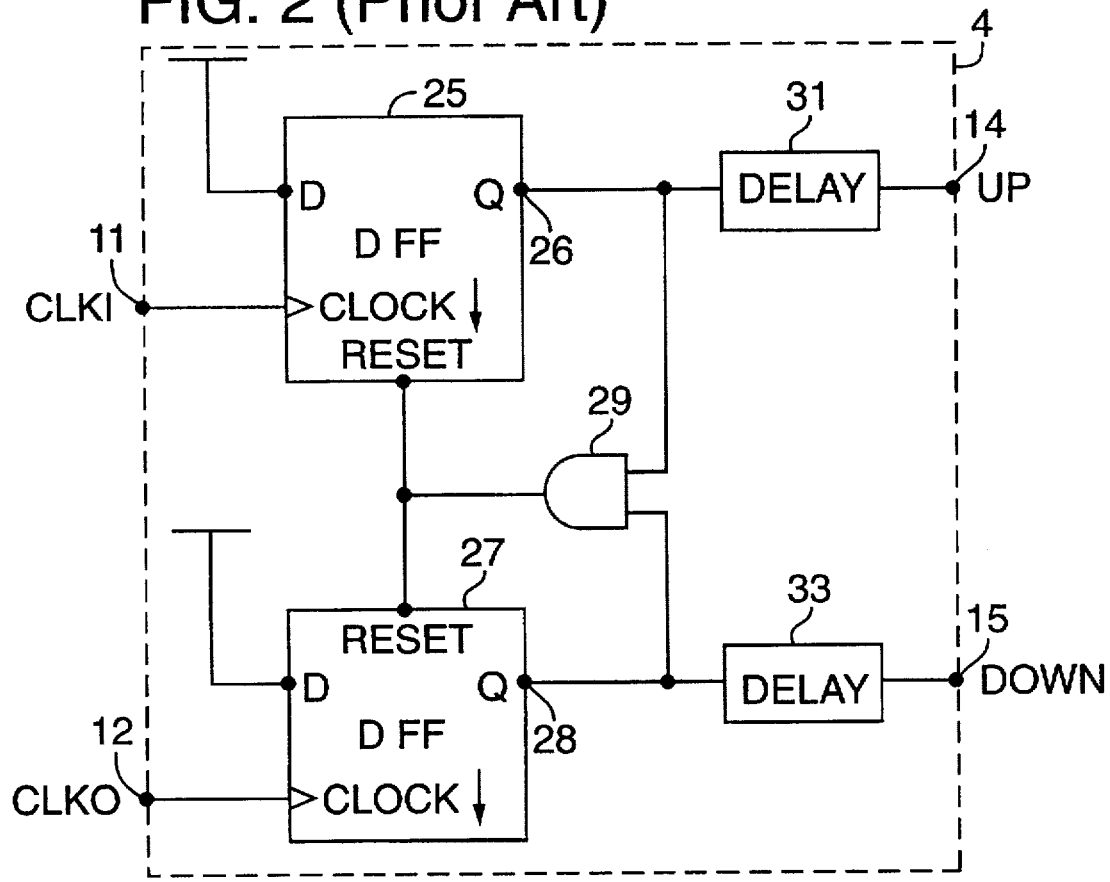
FIG. 2 shows a block diagram of a typical phase detector 4 depicted in FIG. 1.
Figure 2A:
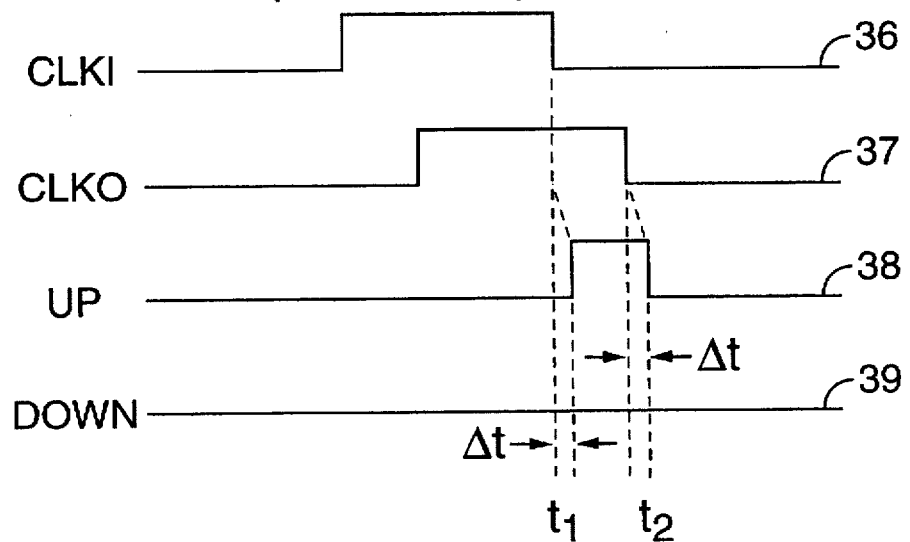
FIG. 2A shows a timing diagram of various voltages within phase detector 4 of FIG. 2 while in operation.
Figure 3:
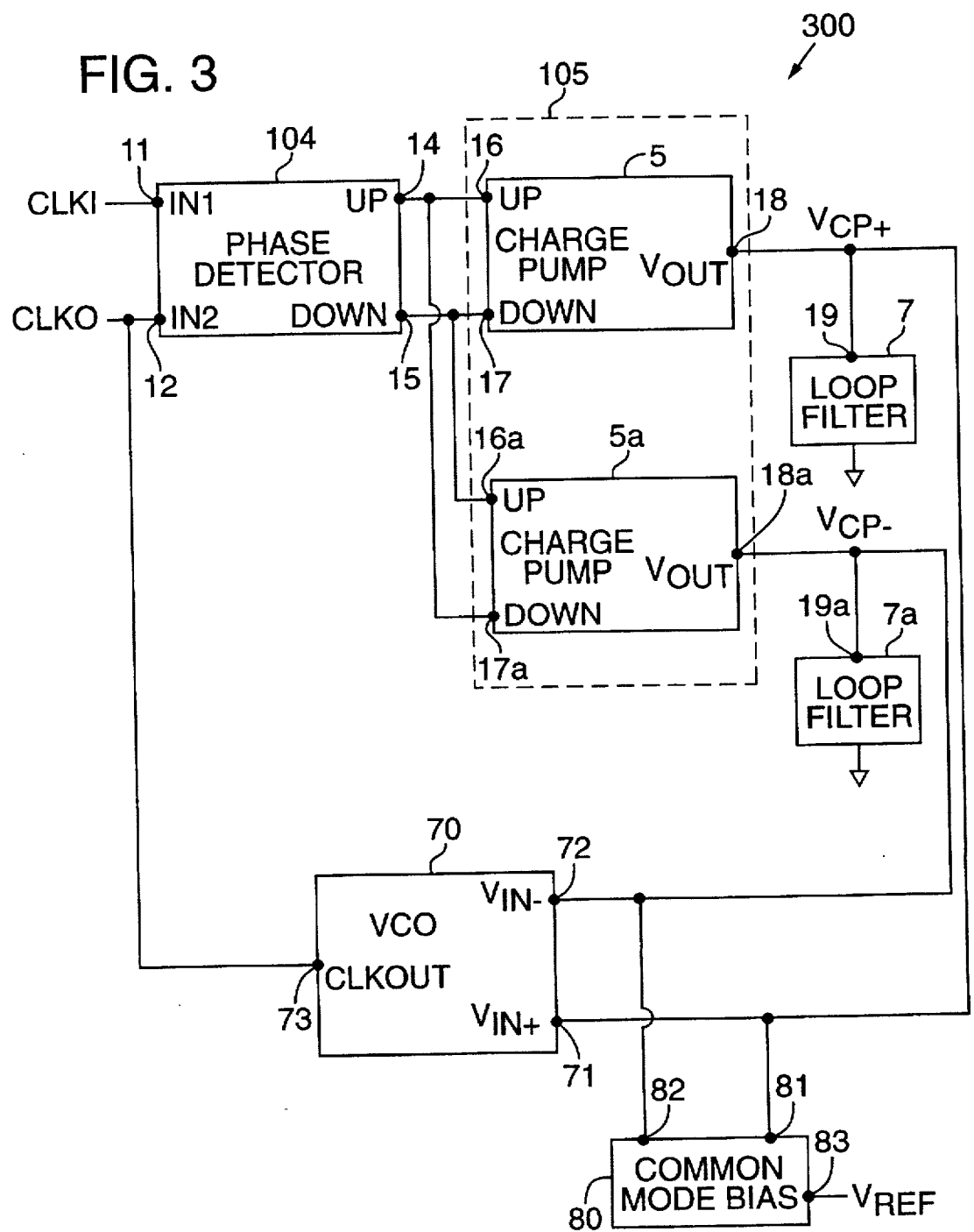
FIG. 3 shows a block diagram of a differential charge pump based phase locked loop 300 according to one embodiment of the present invention.

FIG. 3 shows a block diagram of a differential charge pump phase locked loop 300 according to one embodiment of the present invention. Hereinafter, where elements function substantially the same as elements in prior figures, the same reference numerals are employed. Phase locked loop 300 includes a phase detector 104, a differential charge pump formed from charge pumps 5 and 5a, a loop filter 7, a loop filter 7a, a common mode bias circuit 80 and a voltage-controlled oscillator 70.

Phase detector 104 of phase locked loop 300 receives clock signals CLKI and CLKO at terminals 11 and 12, respectively. When clock signal CLKI leads clock signal CLKO, phase detector 104 generates a pulse on output terminal 14. This pulse causes charge pump 5 to add charge to output terminal 18, thereby increasing voltage $V_{CP+}$. At the same time, this pulse causes charge pump 5a to remove charge from output terminal 18a thereby decreasing voltage $V_{CP-}$. As a result, the difference between voltages $V_{CP+}$ and $V_{CP-}$ is increased. Loop filters 7 and 7a stabilize the loop. Voltage-controlled oscillator 70 detects the increased voltage difference between voltages $V_{CP+}$ and $V_{CP-}$ and increases the frequency of clock signal CLKO to align clock signal CLKO to clock signal CLKI. Phase locked loop 300 constantly attempts to align clock signal CLKO with clock signal CLKI in frequency and phase.

Conversely, when clock signal CLKI lags clock signal CLKO, phase detector 104 generates a pulse on output terminal 15, which causes charge pump 5a to add charge to output terminal 18a, thereby increasing voltage $V_{CP-}$. At the same time, the pulse on output terminal 15 causes charge pump 5 to remove charge from output terminal 18, thereby decreasing voltage $V_{CP+}$. Thus, the difference between voltages $V_{CP+}$ and $V_{CP-}$ is decreased. Voltage-controlled oscillator 70 detects this decreased voltage difference between voltages $V_{CP+}$ and $V_{CP-}$ and decreases the frequency of clock signal CLKO to align clock signal CLKO with clock signal CLKI.

Figure 4:
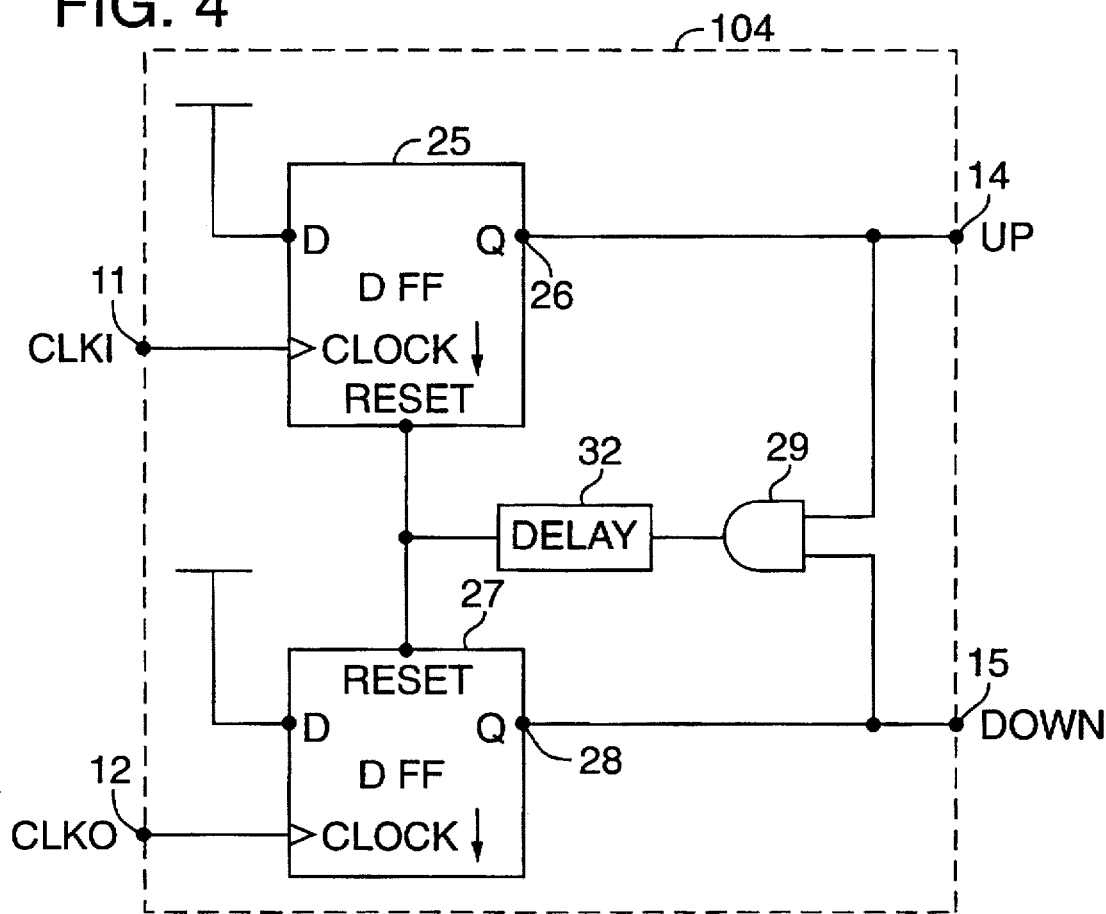
FIG. 4 shows a block diagram of one embodiment of a phase detector 104 depicted in FIG. 3.

FIG. 4 shows a block diagram of phase detector 104 according to one embodiment of the present invention. Phase detector 104 includes a D flip flop 25, a D flip flop 27, an AND gate 29 and a delay block 32. D flip flops 25 and 27 are falling edge triggered flip-flops having their D input terminals connected to a logic one voltage level. As a result, at every falling edge on their clock terminals, the D flip flops generate a logic one output signal at their Q output terminals 26 and 28. After a small delay, AND gate 29 resets D flip flops 25 and 27 when the voltages on Q output terminals 26 and 28 are both at a logic one level.

Figure 4A:
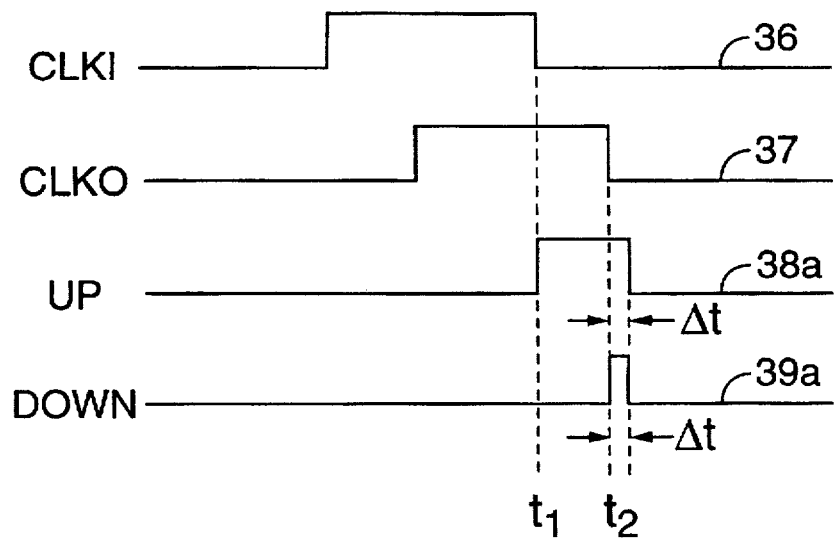
FIG. 4A shows a timing diagram of various voltages within phase detector 104 of FIG. 4 while in operation.

FIG. 4A shows a timing diagram of various voltages within phase detector 104 while in operation. In this example, clock signal CLKI, illustrated by a waveform 36, leads clock signal CLKO, illustrated by a waveform 37. The voltage on Q output terminal 26 rises to a logic one at time $t_1$ when clock signal CLKI has a falling edge. The voltage on Q output terminal 28 rises to a logic one at time $t_2$, which resets D flip flops 25 and 27 after a small delay, $\Delta t$. Thus, as shown in waveform 38a, an output pulse width equal to the phase difference between the falling edges of clock signals CLKI and CLKO plus the small delay, $\Delta t$, is transmitted on output terminal 14. As shown in waveform 39a, a pulse having a pulse width equal to $\Delta t$ is transmitted on output terminal 15 because delay block 32 causes a small delay before the D flip flops 25 and 26 are reset by AND gate 29.

Figure 5:
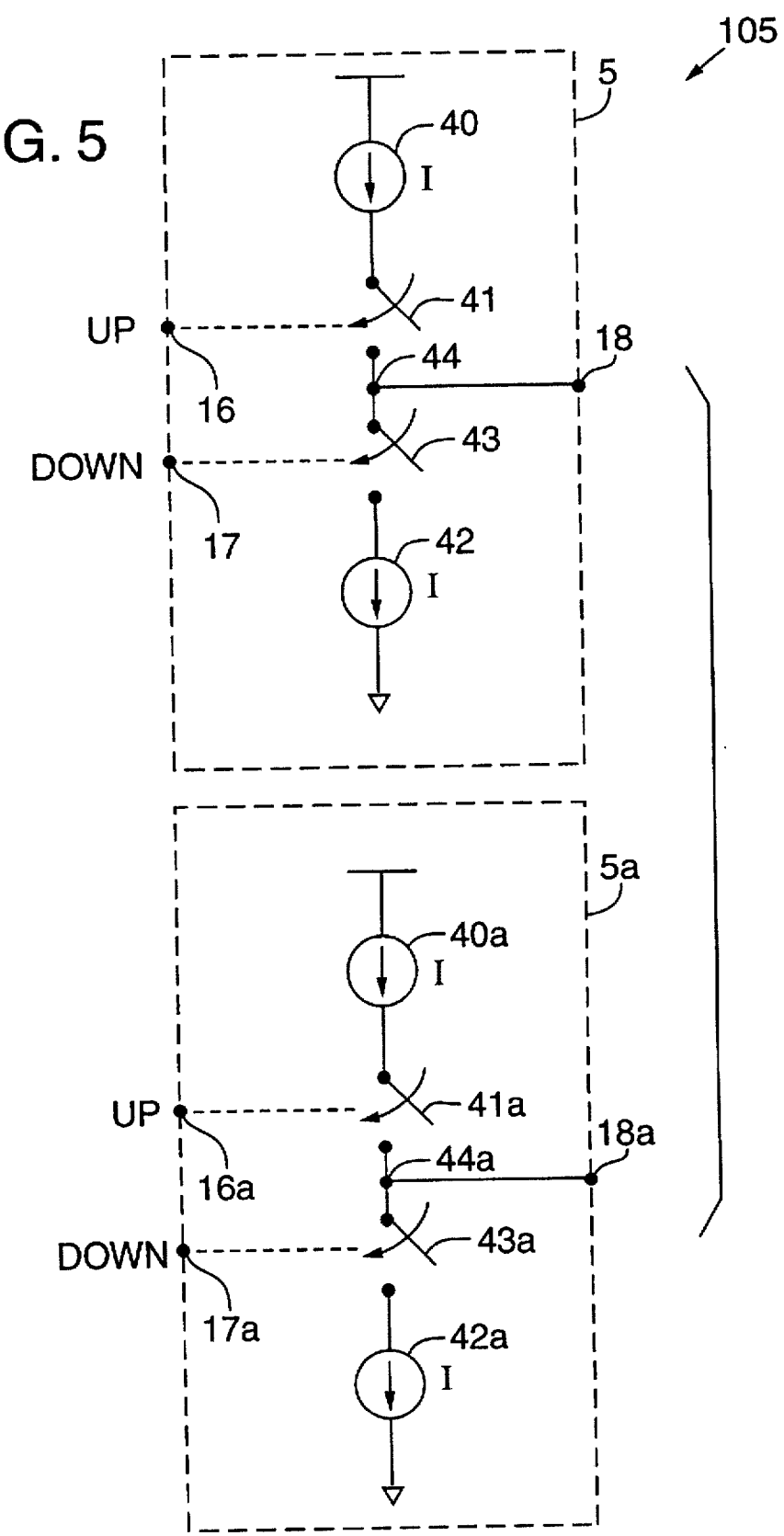
FIG. 5 shows a block diagram of one embodiment of a charge pump 5 depicted in FIG. 3.

FIG. 5 shows a block diagram of a differential charge pump in accordance with one embodiment of the present invention, comprising charge pumps 5 and 5a. Charge pump 5 includes a charging current source 40, a discharging current source 42, an "UP" switch 41 and a "DOWN" switch 43.

Switches 41 and 43 are controlled by the voltages on input terminal 16 and input terminal 17, respectively. A pulse on input terminal 16 closes "UP" switch 41 for the duration of the pulse, thereby coupling current source 40 to charge node 44, so as to increase the voltage at output terminal 18.

Similarly, a pulse on input terminal 17 closes "DOWN" switch 43 for the duration of the pulse, thereby coupling discharging current source 42 for the duration of the pulse to remove charge from node 44, so as to decrease the voltage at output terminal 18.

Charge pump 5a includes a charging current source 40a, a discharging current source 42a, an "UP" switch 41a and a "DOWN" switch 43a.

Switches 41a and 43a are controlled by the voltages on input terminal 16a and input terminal 17a, respectively. A pulse on input terminal 16a closes "UP" switch 41a for the duration of the pulse, thereby coupling current source 40a to charge node 44a, so as to increase the voltage at output terminal 18a.

Similarly, a pulse on input terminal 17a closes "DOWN" switch 43a for the duration of the pulse, thereby coupling discharging current source 42a for the duration of the pulse to remove charge from node 44a, so as to decrease the voltage at output terminal 18a.

Figure 6:
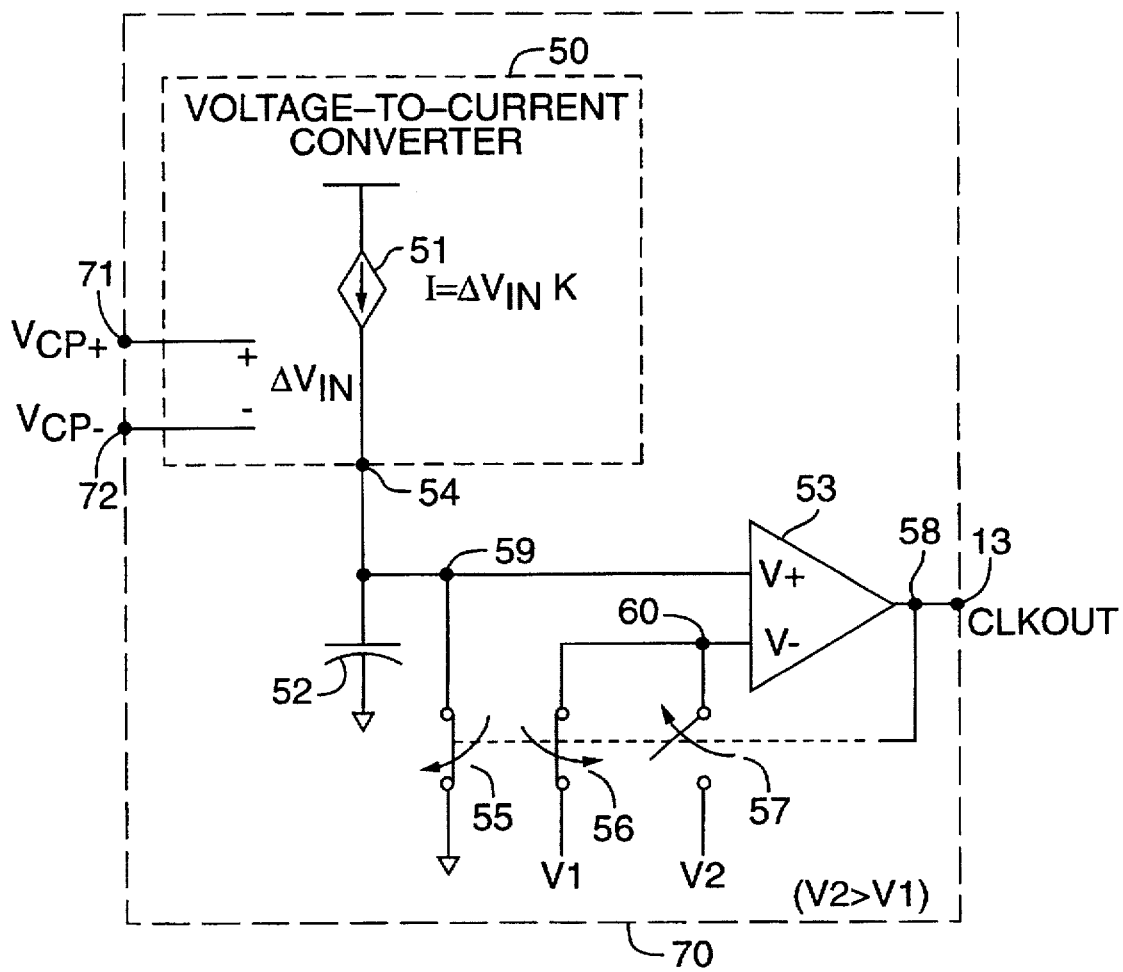
FIG. 6 shows a block diagram of a voltage-controlled oscillator 70 according to one embodiment of the present invention.

FIG. 6 shows a block diagram of a differential voltage-controlled oscillator 70 in accordance with one embodiment of the present invention. Differential voltage-controlled oscillator 70 includes a voltage-to-current converter 50, a capacitor 52, a comparator 53, and switches 55, 56 and 57. Voltage-to-current converter 50 further includes a dependent current source 51.

Voltage-to-current converter 50 receives the voltages $V_{CP+}$ and $V_{CP-}$ at input terminals 71 and 72 and provides a current at terminal 54 proportional to a voltage difference $\Delta V_{IN}$ between terminals 71 and 72. The current provided by voltage-to-current converter 50 to terminal 54 is used to charge capacitor 52.

During operation, the signal generated by comparator 53 at node 58 is either at a logic "one" or logic "zero" voltage level. When the signal generated by comparator 53 is a logic "one", switches 55 and 56 are closed, and switch 57 is open. As a result, switch 55 couples node 59 to GROUND and discharges capacitor 52, thereby causing a decreasing voltage on node 59. Switch 56 couples a voltage V1 to a node 60 at the V-terminal of comparator 53. Thus, comparator 53 compares the decreasing voltage on node 59 to voltage V1. When the voltage on node 59 drops below voltage V1, comparator 53 generates a logic "zero" voltage level at node 58, which is connected to CLKOUT terminal 13. The logic "zero" voltage level at node 58 opens switches 55 and 56 and closes switch 57. When switch 55 is open, voltage-to-current converter 50 charges capacitor 52, thereby increasing voltage on node 59. Because switch 56 is open and switch 57 is closed, a voltage V2 is coupled to the V-terminal of comparator 53. Consequently, comparator 53 compares the increasing voltage on node 59 to voltage V2. When the voltage on node 59 rises above voltage V2, comparator 53 generates a logic "one" voltage level at node 58, which is connected to CLKOUT terminal 13. The charging and discharging cycles of capacitor 52 repeats indefinitely so that comparator 53 generates clock signal CLKO at CLKOUT terminal 13.

In FIG. 6, the voltage difference between the voltages $V_{CP+}$ and $V_{CP-}$ at input terminals 71 and 72, respectively, controls the frequency of the clock signal CLKO. When the voltage difference $\Delta V_{IN}$ is increased, current source 51 provides a larger current, which in turn charges capacitor 52 more quickly. The increased charging rate causes the voltage across capacitor 52 to reach voltage V2 more quickly, which causes comparator 53 to transition from a logic "zero" output signal to a logic "one" output signal more quickly. As a result, the frequency of clock signal CLKO is increased. Conversely, when the voltage difference $\Delta V_{IN}$ between the voltages at input terminals 71 and 72 is decreased, current source 51 provides a smaller current, which charges capacitor 52 more slowly. Thus, the voltage across capacitor 52 reaches voltage V2 more slowly, thereby increasing the time it takes comparator 53 to transition from a logic "zero" output signal to a logic "one" output signal. As a result, the frequency of clock signal CLKO is decreased.

Figure 6A:
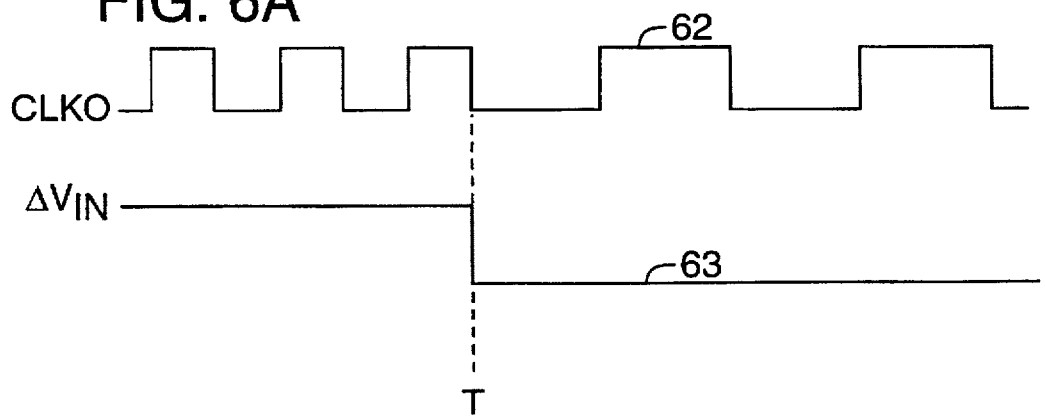
FIG. 6A shows a timing diagram showing clock signal CLKO and $\Delta V_{IN}$ within the voltage-controlled oscillator of FIG. 6.

FIG. 6A is a timing diagram showing waveform 62 of clock signal CLKO and waveform 63 of the differential voltage $\Delta V_{IN}$ within differential voltage-controlled oscillator 70. As discussed above, clock signal CLKO has a frequency related to the magnitude of voltage difference $\Delta V_{IN}$ at input terminals 71 and 72. When voltage difference $\Delta V_{IN}$ decreases at time T as shown in waveform 63, the frequency of clock signal CLKO also decreases as shown in waveform 62.

Figure 7:
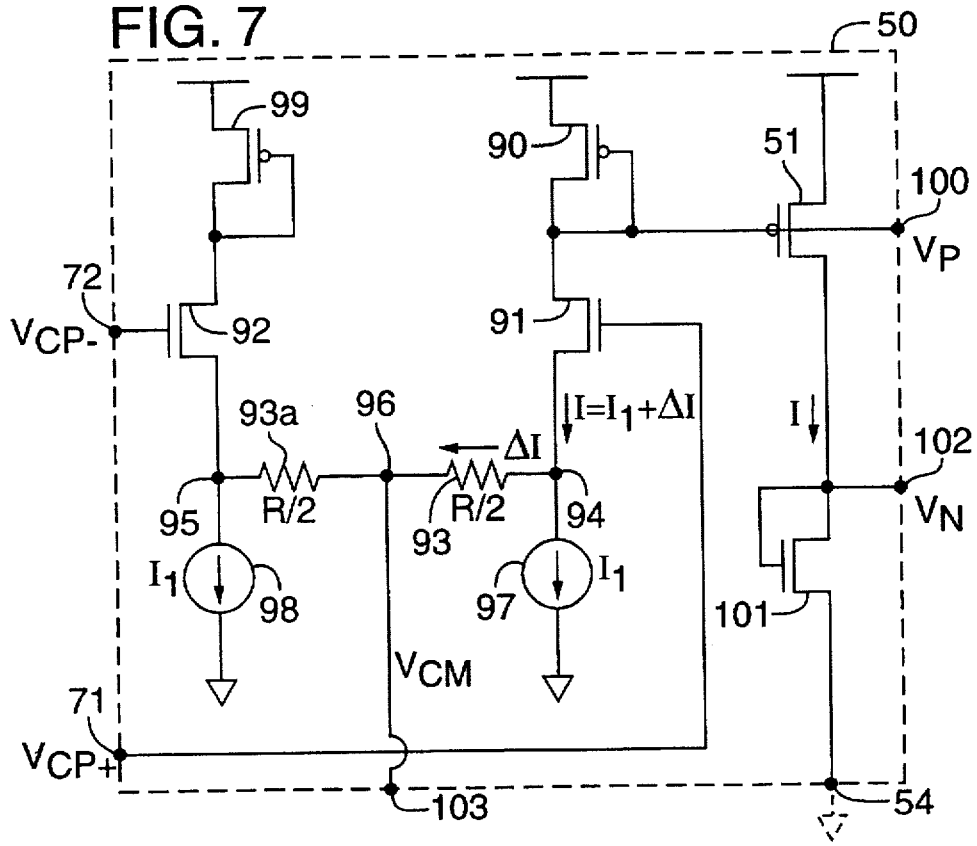
FIG. 7 shows a circuit diagram of one embodiment of the voltage-to-current converter 50 depicted in FIG. 5.

FIG. 7 shows a circuit diagram of one embodiment of voltage-to-current converter 50. In FIG. 7, Voltage $V_{CP+}$ is provided on the gate of N-channel transistor 91, and voltage $V_{CP-}$ is provided on the gate of N-channel transistor 92. Transistor 91 and current source 97 form a source follower circuit so that the voltage at node 94 is proportional to voltage $V_{CP+}$. Likewise, transistor 92 and current source 98 form a source follower circuit so that the voltage at node 95 is proportional to voltage $V_{CP-}$. When voltages $V_{CP+}$ and $V_{CP-}$ are equal (i.e., when phase locked loop 300 is in locked condition), the voltages at nodes 94 and 95 are equal because transistors 91 and 92 are substantially identical and both conduct current $I_1$. Consequently, when voltage $V_{CP+}$ rises relative to voltage $V_{CP-}$, the voltage at node 94 rises relative to the voltage at node 95, causing current $\Delta I$, proportional to the difference between voltages $V_{CP+}$ and $V_{CP-}$, to flow from node 94, through node 96 and resistors 93 and 93a, to node 95. As a result, transistor 91 conducts current I which is equal to $I_1+\Delta I$. The current in N-channel transistor 91 also flows in P-channel transistor 90 and is mirrored to P-channel transistor 51 so that a current I is also conducted in transistor 51. Consequently, P-channel transistor 51 also conducts a current $I_1+\Delta I$, which is output to terminal 54 through diode connected transistor 101. In some embodiments, diode connected transistor 101 is optional.

Figure 7A:
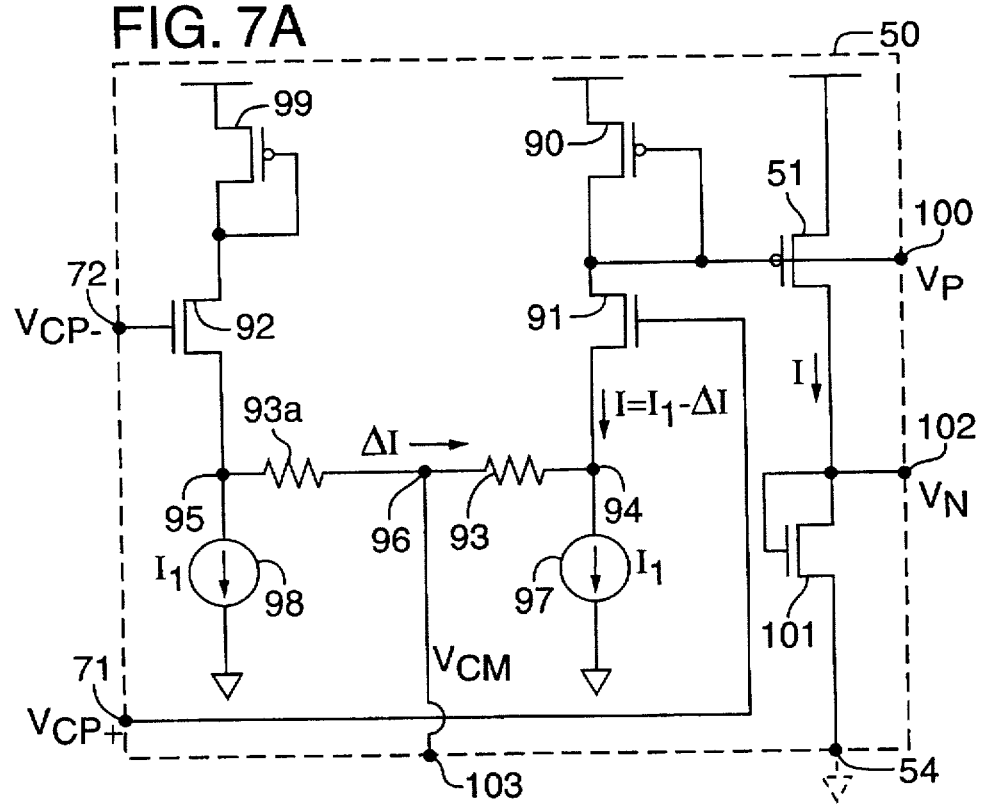
FIG. 7A shows the current flow within the embodiment of FIG. 7 when voltage $V_{CP+}$ is less than voltage $V_{CP-}$.

As shown in FIG. 7A, when voltage $V_{CP+}$ drops relative to voltage $V_{CP-}$, the voltage at node 94 drops relative to the voltage at node 95, causing current $\Delta I$, proportional to the difference between voltages $V_{CP-}$ and $V_{CP+}$, to flow from node 96 to node 95. In this case, $\Delta I$ is in the opposite direction from that $\Delta I$ discussed above, and transistor 91 conducts a current $I_1-\Delta I$. Thus, the current conducted by transistor 51 is a function of the differential voltage present at terminals 71 and 72.

Figure 8:
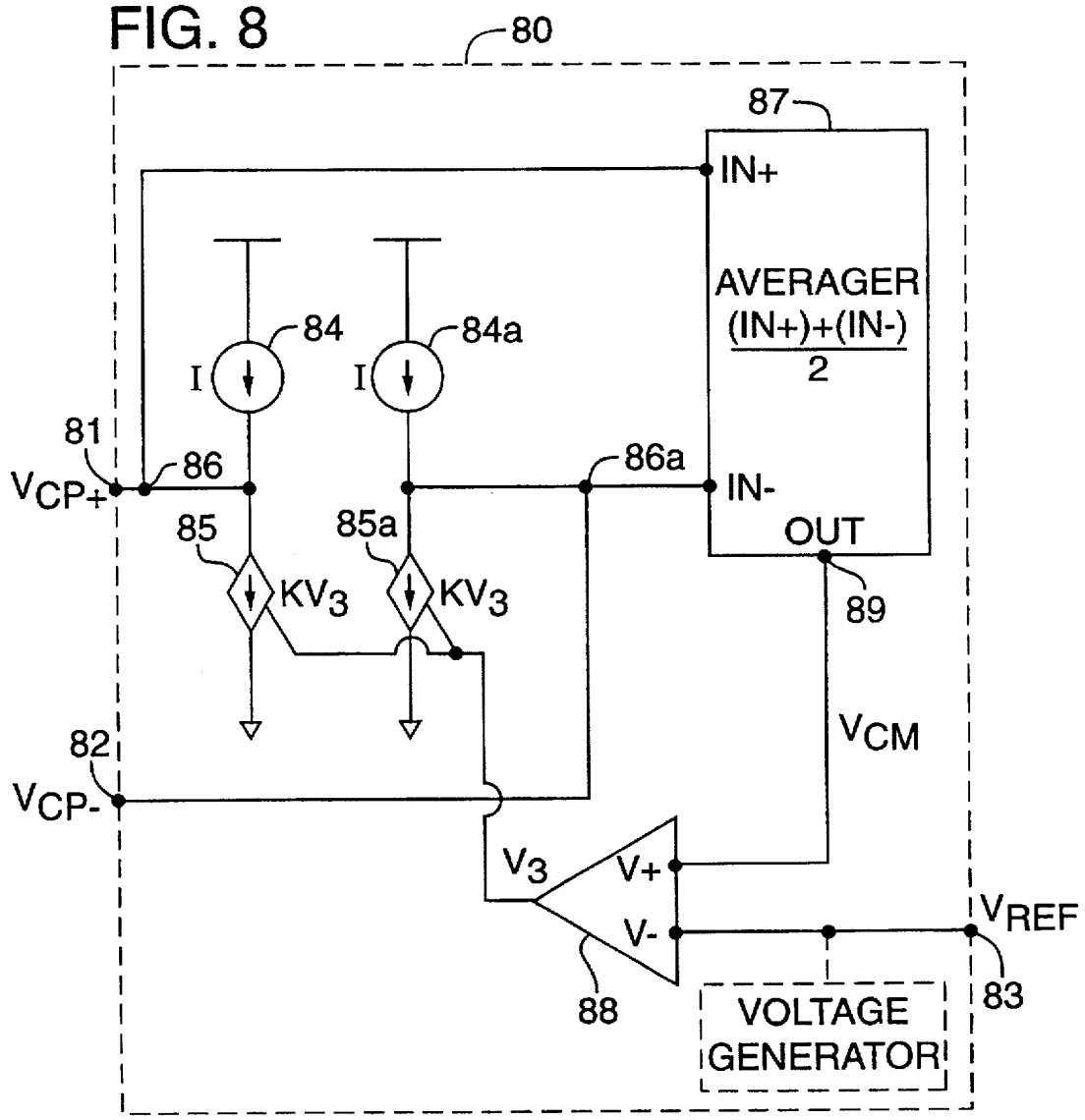
FIG. 8 shows a block diagram of a common mode bias circuit 80 according to one embodiment of the present invention.

FIG. 8 shows a block diagram of common mode bias circuit 80 (FIG. 3) according to one embodiment of the present invention. During operation of phase locked loop 300 (FIG. 3), the voltage difference between voltage $V_{CP+}$ and voltage $V_{CP-}$ on the charge pump output terminals 18 and 18a (FIG. 3), respectively, is forced to the differential voltage required to make clock signals CLKI and CLKO equal in frequency and phase. However, the common mode voltage on output terminals 18 and 18a is not affected by the loop. Common mode bias circuit 80 adjusts the common mode voltage on output terminals 18 and 18a and sets the common mode voltage to optimize the voltage swing available at the output terminals 18 and 18a.

As shown in FIG. 8, terminals 81 and 82 of common mode bias circuit 80 are coupled to nodes 86 and 86a to receive voltages $V_{CP+}$ and $V_{CP-}$ respectively. Averager 87 detects the voltages $V_{CP+}$ and $V_{CP-}$ at nodes 86 and 86a and generates a voltage $V_{CM}$ at OUT node 89 that is the average value of the voltages $V_{CP+}$ and $V_{CP-}$ and is equal to $(V_{CP+}+V_{CP-})/2$. Amplifier 88 compares this average value (i.e., the common mode voltage) to a reference voltage $V_{REF}$ present at terminal 83 to provide an output control signal $V_3$ for controlling dependent current sources 85 and 85a. Reference voltage $V_{REF}$ is set to a desired level to maximize voltage swing available at the output of the differential charge pump. In accordance with one embodiment, voltage $V_{REF}$ is generated by a voltage generator included in common mode bias circuit 80.

When common mode voltage $V_{CM}$ is less than reference voltage $V_{REF}$, dependent current sources 85 and 85a conduct less current than constant current sources 84 and 84a, thereby increasing voltages $V_{CP+}$ and $V_{CP-}$. When the common mode voltage is greater than the reference voltage $V_{REF}$, dependent current sources 85 and 85a to conduct more current than constant current sources 84 and 84a, thereby decreasing voltages $V_{CP+}$ and $V_{CP-}$. In this manner, amplifier 88 continuously monitors voltages $V_{CM\ m}$ and $V_{REF}$ and adjusts the voltages at nodes 86 and 86a in the direction of decreasing the difference between voltages $V_{CM}$ and $V_{REF}$. Common mode bias circuit 80 stabilizes when common mode voltage $V_{CM}$ equals reference voltage $V_{REF}$, and at this point, dependent current sources 85 and 85a conduct the same current as current sources 84 and 84a. Hence, when a disturbance upsets the common mode voltage, common mode bias circuit 80 will return the average value of voltages $V_{CP+}$ and $V_{CP-}$ to the reference value.

The differential scheme implemented in phase locked loop 300 reduces the static phase error to near zero under locked condition through cancellation of errors. In the embodiment discussed above, matched current sources in a charge pump are used. In practice, current sources within a charge pump are difficult to match; however, two charge pumps can be matched very closely. Phase locked loop 300 generates a minimum pulse on each of phase detector output terminals 14 and 15 when phase locked loop 300 is under locked condition to reduce static phase error caused by leakage currents at charge pump output terminals 18 and 18a. Substantial cancellation of the resulting four error sources described above for phase locked loop 1 occurs because charge pumps 5 and 5a are manufactured to be substantially identical to each other, and loop filters 7 and 7a are manufactured to be substantially identical to each other.

As stated above, generally the current sources within the charge pumps are mismatched. However, because charge pumps 5 and 5a are substantially identical, the current mismatch of charge pump 5 is substantially identical with the current mismatch of charge pump 5a and, thus, causing substantially identical changes in voltages $V_{CP+}$ and $V_{CP-}$, respectively. Similarly, unequal switching times within charge pump 5 are substantially identical with the unequal switching times within charge pump 5a and, thus, causing substantially the same changes in voltages $V_{CP+}$ and $V_{CP-}$. Likewise, because charge pumps 5 and 5a are substantially identical, unequal charge injection from the switches within charge pump 5 is substantially identical with the unequal charge injection from the switches in charge pump 5a, thereby causing substantially the same changes in voltages $V_{CP+}$ and $V_{CP-}$. For the same reason, the leakage current at charge pump 5's output terminal is substantially identical with the leakage current at charge pump 5a's output terminal, thereby causing substantially the same changes in voltages $V_{CP+}$ and $V_{CP-}$. Thus, voltages $V_{CP+}$ and $V_{CP-}$ have substantially the same changes in voltage and, as a result, the voltage difference between voltages $V_{CP+}$ and $V_{CP-}$ remains substantially unchanged. Because differential voltage-controlled oscillator 70 generates clock signal CLKO in response to the difference between voltages $V_{CP+}$ and $V_{CP-}$, clock signal CLKO's phase and frequency is substantially unchanged despite the error sources described above.

Because common mode noise couples equally into voltages $V_{CP+}$ and $V_{CP-}$, errors due to noise in voltages $V_{CP+}$ and $V_{CP-}$ are minimized through cancellation. Thus, the voltage increase caused by the resistor of loop filters 7 and 7a cancels because loop filters 7 and 7a are substantially identical and, thus, the voltage increase of $V_{CP+}$ and $V_{CP-}$ will be substantially identical. Further, many noise sources originate in the power supplies, substrates and adjacent signals, can be made with careful layout, to couple substantially equally into voltages $V_{CP+}$ and $V_{CP-}$.

Yet another advantage of phase locked loop 300 over typical phase locked loop 1 is that the effective voltage range on the charge pump output terminals 18 and 18a is doubled because the differential charge pump circuit (i.e. the circuit which includes charge pumps 5 and 5a) provides a differential voltage to differential voltage-controlled oscillator 70. That is, the maximum voltage range of voltages $V_{CP+}$ and $V_{CP-}$ is twice that of voltage $V_{CP}$ in phase lock loop 1 because the differential voltage seen by voltage-controlled oscillator 70 is twice what is seen by voltage-controlled oscillator 9.

Figure 9:
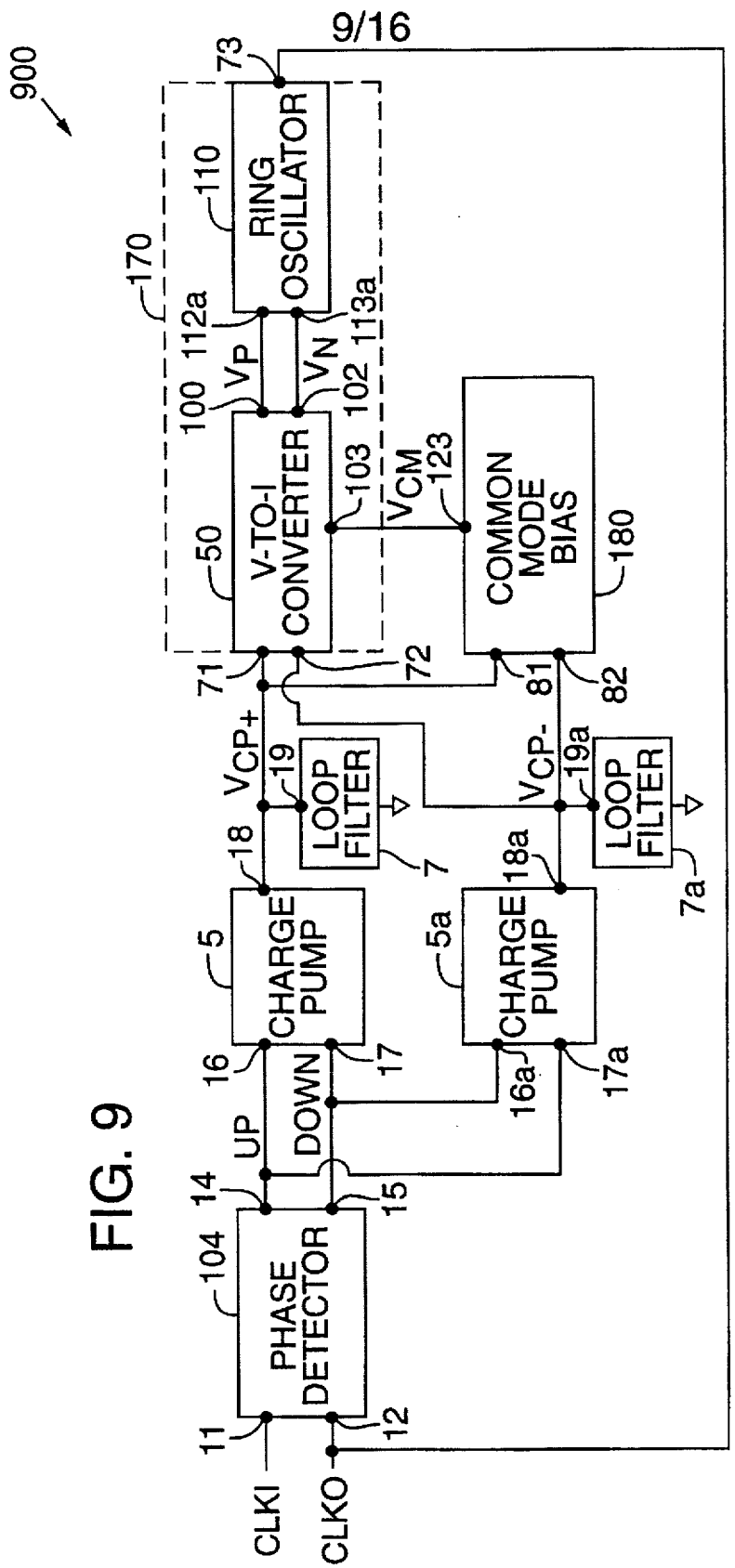
FIG. 9 shows a block diagram of a second embodiment of a differential charge pump based phase locked loop 900 according to the present invention.

FIG. 9 shows a block diagram of a second embodiment of a phase locked loop according to the present invention. Phase locked loop 900 is similar to phase locked loop 300 (FIG. 3), but differs from phase locked loop 300 in the implementation of differential voltage-controlled oscillator 170 and common mode bias circuit 180. Differential voltage-controlled oscillator 170 comprises voltage-to-current converter 50 and ring oscillator 110. The speed at which ring oscillator 110 operates is controlled by the current generated by voltage-to-current converter 50. Similar to phase locked loop 300, phase locked loop 900 employs a differential scheme to reduce static phase errors under locked condition through cancellation of errors.

In this embodiment, voltage-to-current converter 50 generates the common mode voltage $V_{CM}$. As discussed above in conjunction with FIG. 7, voltage $V_{CM}$ is generated by voltage-to-current converter 50 and output at terminal 103, which is coupled to node 123 of common mode bias circuit 180 (FIG. 9). Referring back to FIG. 7, transistor 91 and current source 97 form a source follower circuit. As a result, the voltage on node 94 approximates the voltage on the gate of transistor 91. $V_{CP+}$ minus the threshold voltage of transistor 91. Similarly, transistor 92 and current source 98 form a source follower circuit and, thus, the voltage on node 95 approximates $V_{CP-}$ minus the threshold voltage of transistor 92. Transistors 91 and 92 are designed so that their threshold voltages are substantially identical, and resistors 93 and 93a are designed to have substantially equal resistances. As a result, the voltage at node 96 is substantially at the midpoint between the voltages at nodes 94 and 95. Thus, the voltage at node 96 (and terminal 103) is substantially equal to the average of voltages $V_{CP+}$ and $V_{CP-}$, minus a threshold voltage.

Figure 10:
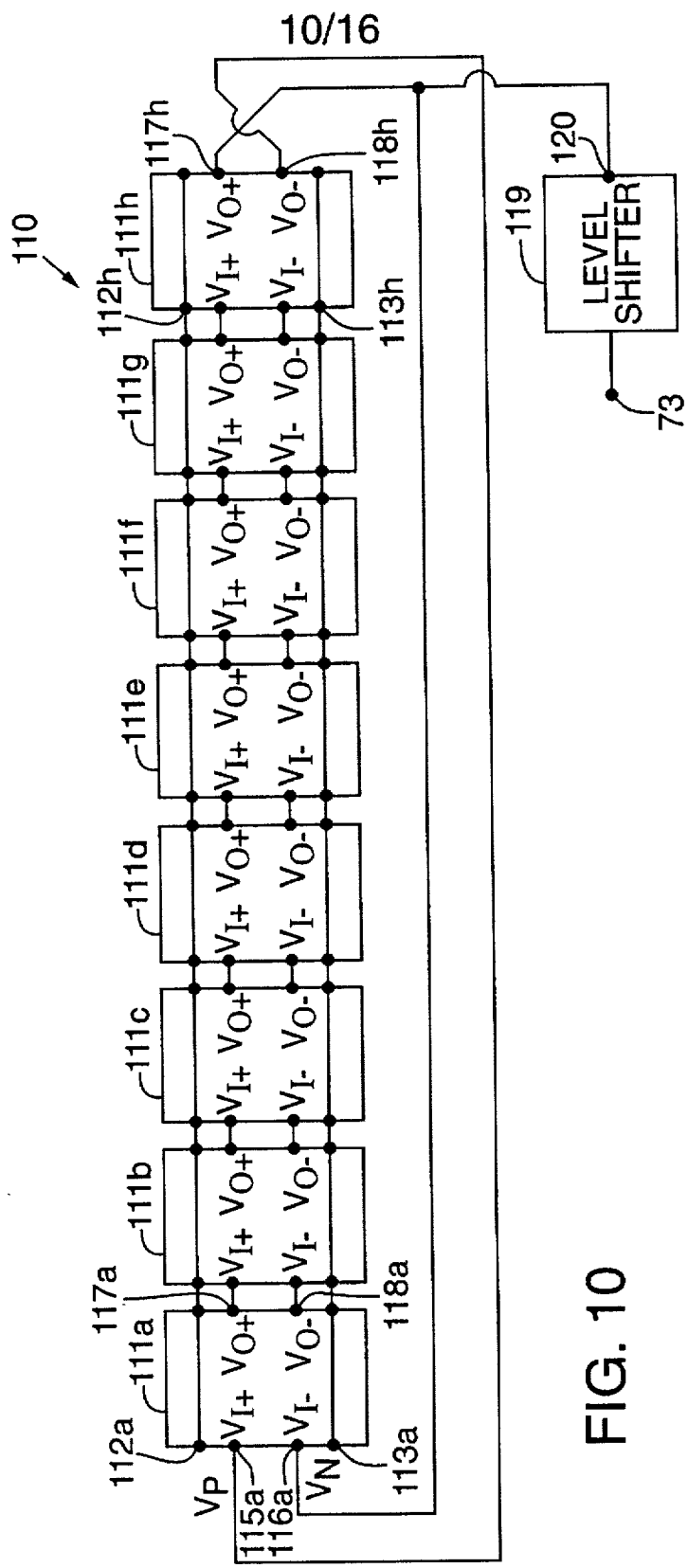
FIG. 10 shows a block diagram of one embodiment of a ring oscillator 110 depicted in FIG. 9.

FIG. 10 shows a block diagram of ring oscillator 110 depicted in the differential phase locked loop 900 of FIG. 9. Ring oscillator 110 is an eight stage oscillator formed by substantially identical stages 111a–111h. Unlike differential voltage-controlled oscillator 70 of FIG. 6, in differential voltage-controlled oscillator 170, terminal 54 of voltage-to-current converter 50 (FIG. 7) is coupled to GROUND rather than a terminal of capacitor 52. In the embodiment of FIG. 9, voltages $V_P$ from node 100 and $V_N$ from node 102 of voltage-to-current converter 50 (FIG. 7) are coupled to terminals 112a and 113a of ring oscillator 110's stage 111a, respectively. As shown in FIG. 10, in stages 111b–111h, the input $V_{I+}$ and $V_{I-}$ nodes are connected to the output $V_{O+}$ and $V_{I-}$ nodes of the previous stage in the ring, respectively. In stage 111a, $V_{I+}$ node 115a and $V_{I-}$ node 116a are connected to the $V_{O-}$ node 118h and $V_{O+}$ node 117h of stage 111h, respectively. When the output signal of stage 111a is a logic "one", stage 111b generates a logic "one" output signal, which in turn causes stage 111c to generate a logic "one" output signal, and so on to stage 111h. Then when stage 111h generates a logic one output signal, stage 111a generates a logic "zero" output signal because the polarities of the output voltages of stage 111h are connected to stage 111a's input terminals of opposite polarities. The logic "zero" signal is then propagated through the ring to stage 111h. In this manner, alternating logic "zero" and logic "one" signals are propagated through ring oscillator 110 indefinitely. In this embodiment, node 117h provides level shifter 119 at input terminal 120 voltage $V_{O+}$ to generate a 5 volt clock signal at output terminal 73.

Figure 11:
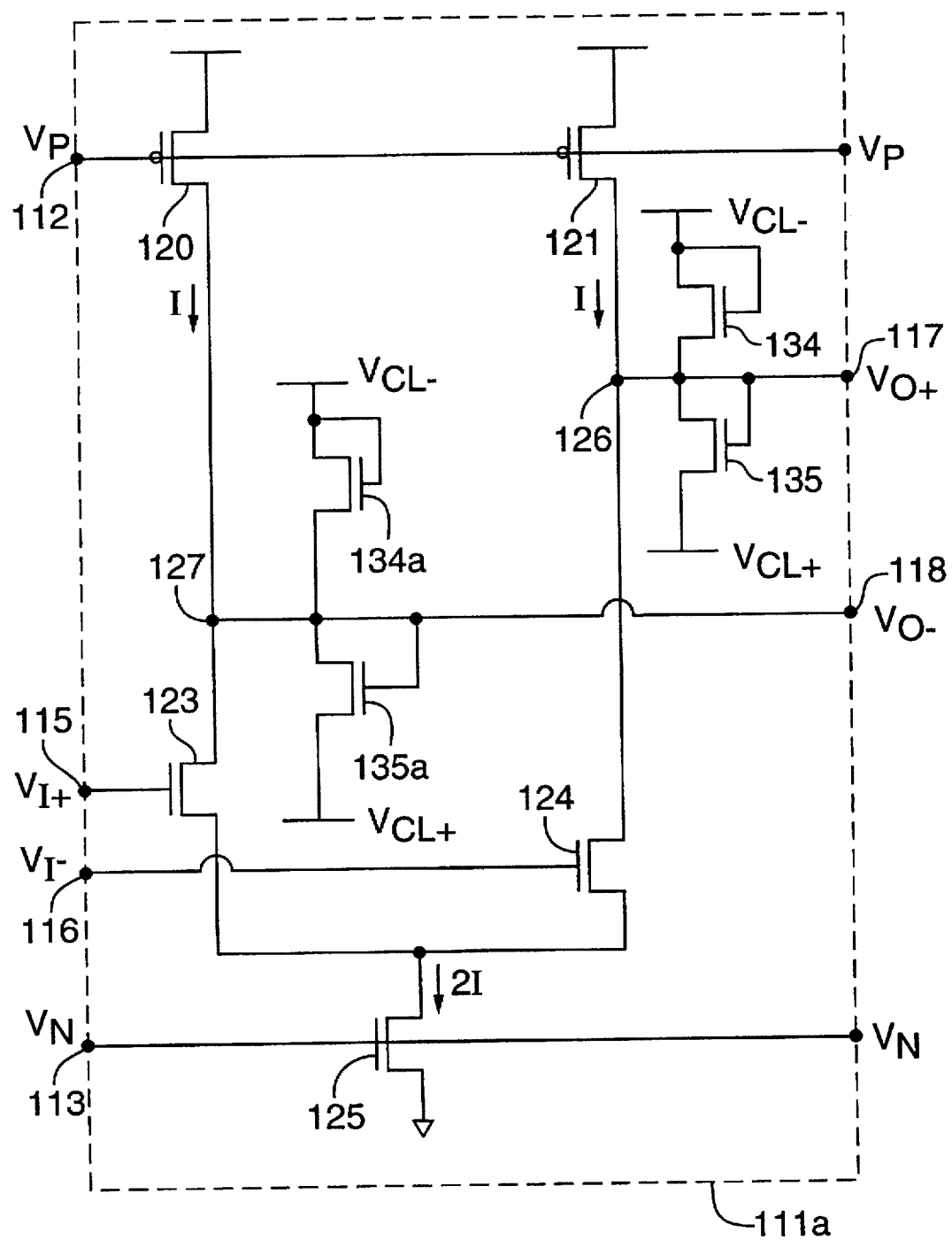
FIG. 11 shows a circuit diagram of one embodiment of a stage of the ring oscillator depicted in FIG. 10.

FIG. 11 shows a circuit diagram of one embodiment of one stage of the ring oscillator of FIG. 10. Terminal 112 is connected to node 100 of voltage-to-current converter 50 (FIG. 7). P-channel transistors 120 and 121 which are controlled by the voltage of terminal 112, hence each conduct current I mirrored from transistor 51 in voltage-to-current converter 50 (FIG. 7).

N-channel transistors 123 and 124 operate as switches controlled by the voltages at nodes 115 and 116, respectively. Thus, when the voltage at $V_{I+}$ terminal 115 transitions from logic "one" to logic "zero" (thus, the voltage at $V_{I-}$ terminal transistors from logic "zero" to logic "one") transistor 123 is forced to the "OFF" state and transistor 124 is forced to the "ON" or conducting state. In the conducting state, transistor 124 conducts current I of transistor 124 to the drain terminal of N-channel transistor 125. The gate terminal of transistor 125 is connected to terminal 113, which is connected to node 102 of voltage-to-current converter 50. Because the source of transistor 101 (FIG. 7) is connected to GROUND in this embodiment, the current in transistor 125 is mirrored from transistor 101 in voltage-to-current converter 50 (FIG. 7). Transistor 125 is designed to have twice the width-to-length ratio of transistor 101 so that transistor 125 conducts a current which is twice the current in transistor 101. Consequently, when transistor 124 is conducting, transistor 125 pulls down the voltage at node 126, until the voltage at node 126 drops to one threshold voltage of transistor 134 below voltage $V_{CL-}$ (impressed at the gate and drain terminals of transistor 134). At that voltage, transistor 134 begins to conduct, thereby clamping the voltage at node 126 substantially at one threshold voltage ($V_T$) below voltage $V_{CL-}$. As a result, the voltage at $V_{O+}$ terminal 117 approximates $V_{CL-}-V_T$. The speed at which the voltage at node 126 is pulled down is directly related to the size of the current conducted by transistor 125. Consequently, when the current conducted by transistor 101 increases, the voltage at node 126 is pulled down faster, thereby causing ring oscillator 110 to operate faster. Conversely, when the current conducted by transistor 101 decreases, the voltage at node 126 is pulled down more slowly, thereby causing ring oscillator 110 to operate more slowly.

At the same time, because transistor 123 is in the "OFF" state, P-channel transistor 120 charges node 127, causing the voltage at node 127 to rise. When the voltage at node 127 rises to one threshold voltage of transistor 135a above voltage $V_{CL+}$ (impressed at the source of transistor 135a), transistor 135a begins to conduct, thereby clamping the voltage at node 127 substantially at one threshold voltage above voltage $V_{CL+}$. As a result, the voltage at $V_{O-}$ terminal 118 approximates $V_{CL+}+V_T$. As stated above, the current conducted by transistor 120 is mirrored from transistor 51 (FIG. 7). Thus, when the current conducted by transistor 51 increases, transistor 120 more quickly charges node 127, thereby increasing the speed at which ring oscillator 110 operates. Conversely, when the current conducted by transistor 51 decreases, transistor 120 more slowly charges node 127, thereby decreasing the speed at which ring oscillator 110 operates.

Similarly, when the voltage at $V_{I+}$ node 115 transitions from logic "zero" to logic "one" (and thus, the voltage at $V_{I-}$ node 116 transitions from logic "one" to logic "zero"), transistor 123 is forced to the "ON" state and transistor 124 is forced to the "OFF" state. Because transistor 123 is in the "ON" state, transistor 125 pulls down the voltage at node 127, which is clamped substantially at one threshold voltage below voltage $V_{CL-}$. Meanwhile, because transistor 124 is in the "OFF" state, transistor 121 charges node 126, thereby increasing the voltage at node 126, which is clamped substantially at one threshold voltage above voltage $V_{CL+}$. Similar to the discussion above, the current conducted by transistors 51 and 101 in voltage-to-current converter 50 (FIG. 7) control the rates at which node 127 is pulled down and node 126 is charged. Because voltage-to-current converter 50 (FIG. 7) controls the current conducted by transistors 51 and 101, voltage-to-current converter 50 also controls the speed at which ring oscillator 110 operates.

Figure 12:
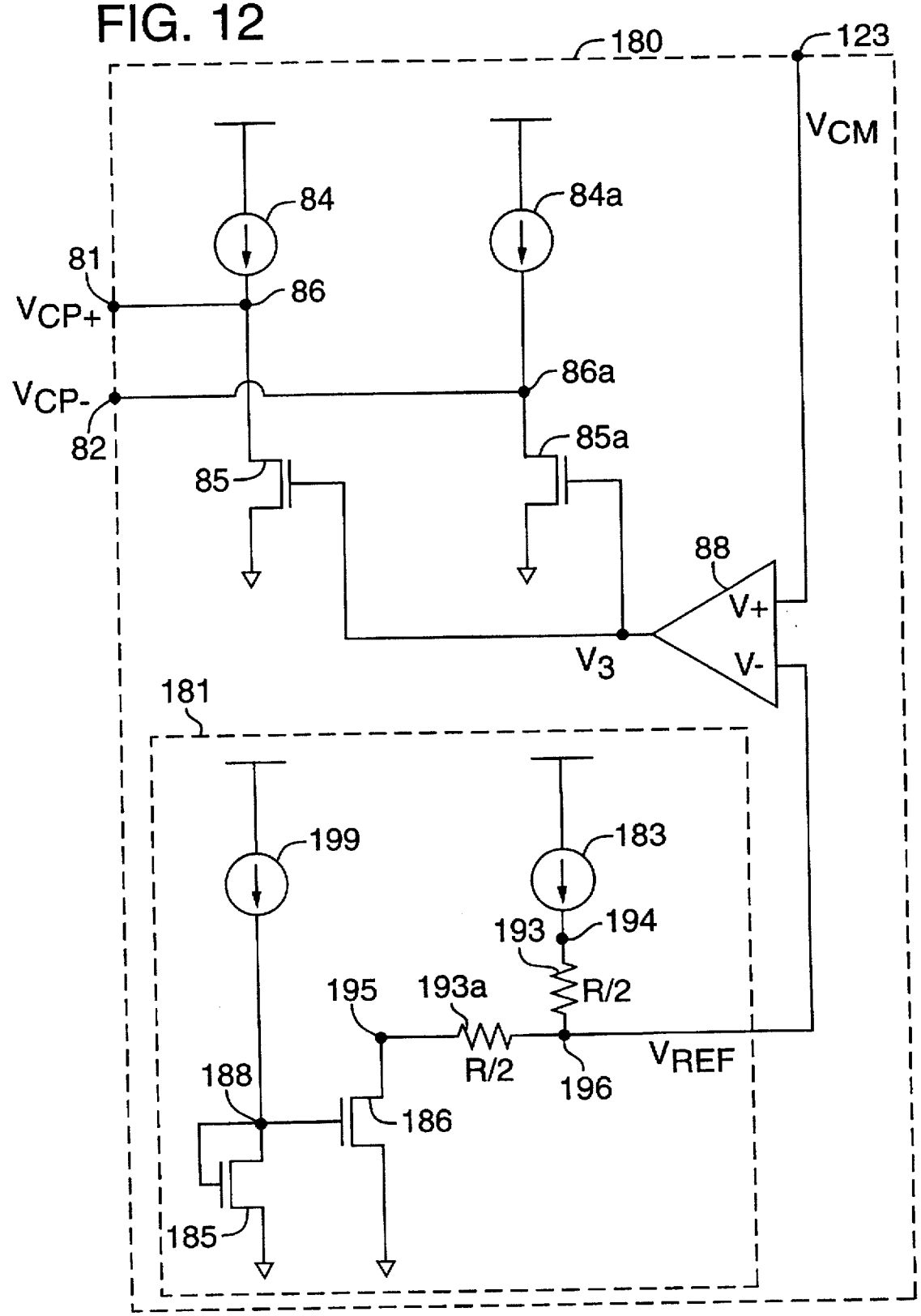
FIG. 12 shows a circuit diagram of one embodiment of a common mode bias circuit 180 depicted in FIG. 9.

FIG. 12 shows a circuit diagram of one embodiment of the common mode bias circuit 180 depicted in FIG. 9. Common mode bias circuit receives common mode voltage $V_{CM}$ at node 123 from terminal 103 of voltage-to-current converter 50 (FIG. 7). Amplifier 88 monitors voltage $V_{CM}$ and voltage $V_{REF}$ generated by voltage generator 181, and outputs a voltage that is a function of the difference between $V_{CM}$ and $V_{REF}$. When $V_{CM}$ is equal to $V_{REF}$, transistors 85 and 85a each conduct substantially the same current as current sources 84 and 84a, respectively. When $V_{CM}$ is greater than $V_{REF}$, amplifier 88 increases the voltage impressed at the gates of transistors 85 and 85a, thereby causing transistors 85 and 85a to conduct more current, which pulls down the voltages at terminals 81 and 82. Similarly, when $V_{CM}$ is less than $V_{REF}$, amplifier 88 decreases the voltage impressed at the gates of transistors 85 and 85a, thereby causing transistors 85 and 85a to conduct less current, which pulls up the voltages at terminals 81 and 82. Common mode bias circuit 180 operates continuously in this manner to adjust $V_{CM}$ in the direction of decreasing the difference between voltages $V_{CM}$ and $V_{REF}$ until they are substantially equal.

Voltage generator 181 includes current sources 183 and 199, transistors 185 and 186, and resistors 193 and 193a and operates to generate reference voltage $V_{REF}$ that optimizes the voltage range of voltages $V_{CP+}$ and $V_{CP-}$. This embodiment of voltage generator 181 is used when current source 97 and 98 in voltage-to-current converter 50 (FIG. 7) are N-channel transistors.

Referring to FIG. 7, the N-channel transistor implementing current source 98 limits the voltage range of voltage $V_{CP-}$ to the voltage necessary to keep current source 98 operating in the saturation region. The minimum voltage necessary to keep current source 98 operating in the saturation region is hereinafter called the "saturation voltage". Accordingly, voltage generator 181 (FIG. 12) is designed to output a voltage substantially equal to the common mode voltage of voltages $V_{CP+}$ and $V_{CP-}$ when voltage $V_{CP-}$ minus a threshold voltage of transistor 92 is equal to the saturation voltage of current source 98. Voltage $V_{CP-}$ reaches its minimum level when the difference between voltages $V_{CP+}$ and $V_{CP-}$ is at its greatest. In this case, substantially all of the current conducted by current source 98 flows from transistor 91 through resistors 93 and 93a. Thus, voltage $V_{CM}$ is approximately the saturation voltage+ the voltage drop across resistor 93a (i.e., $I_I \times R/2$).

Referring back to FIG. 12, resistors 193 and 193a have substantially the same resistance as resistors 93 and 93a (FIG. 7). Current source 183 is substantially similar to current source 98 (FIG. 7) and therefore, conduct current $I_I$, which is conducted through resistors 193 and 193a to the drain of transistor 186. Thus, the voltage drop across resistor 193a is substantially equal to the voltage drop across resistor 93a (FIG. 7).

Current source 199 is designed to conduct current $I_I$ and thus, diode connected transistor 185 also conducts current $I_I$. Transistors 185 and 186 have their sources connected to ground potential and thus, have the same source potential. The gate of transistor 186 is connected to the gate of transistor 185, and has a width-to-length ratio approximately 1.4 times larger than the width-to-length ratio of transistor 185. Because transistors 185 and 186 have the substantially the same source potential, gate potential and drain current, but transistor 186's width-to-length ratio is approximately 1.4 times larger, transistor 186 operates in the linear region resulting in a drain potential proportional to the saturation voltage of the transistor implementing current source 98 (FIG. 7). The drain potential of transistor 186 substantially tracks the variations in the saturation voltage of the transistor implementing current source 98 (FIG. 7) caused by temperature, process, and power supply voltage variations. Accordingly, the voltage at node 196 is approximately the same as voltage $V_{CM}$ when the voltage at node 95 (FIG. 7) is at the saturation voltage. Because voltage generator 181 includes resistors and current sources substantially identical to resistors and current sources in voltage-to-current converter 50 (FIG. 7), the reference voltage substantially identically tracks variations in the saturation voltage due to temperature, process variations and power supply changes. As a result, common mode bias circuit 180 adjusts the common mode voltage to a level to optimize the voltage swing available on the charge pump output terminals 18 and 18a.

The N-channel transistor implementing current source 97 limits the voltage range of voltage $V_{CP+}$ to the saturation voltage of the N-channel transistor implementing current source 97. Because the N-channel transistor implementing current source 97 is substantially identical to the N-channel transistor implementing current source 98, this embodiment of voltage generator 181 also operates to output a voltage substantially equal to the common mode voltage of $V_{CP+}$ and $V_{CP-}$ when voltage $V_{CP+}$ minus a threshold voltage of transistor 91 is equal to the saturation voltage of the N-channel transistor implementing current source 97.

Figure 13:
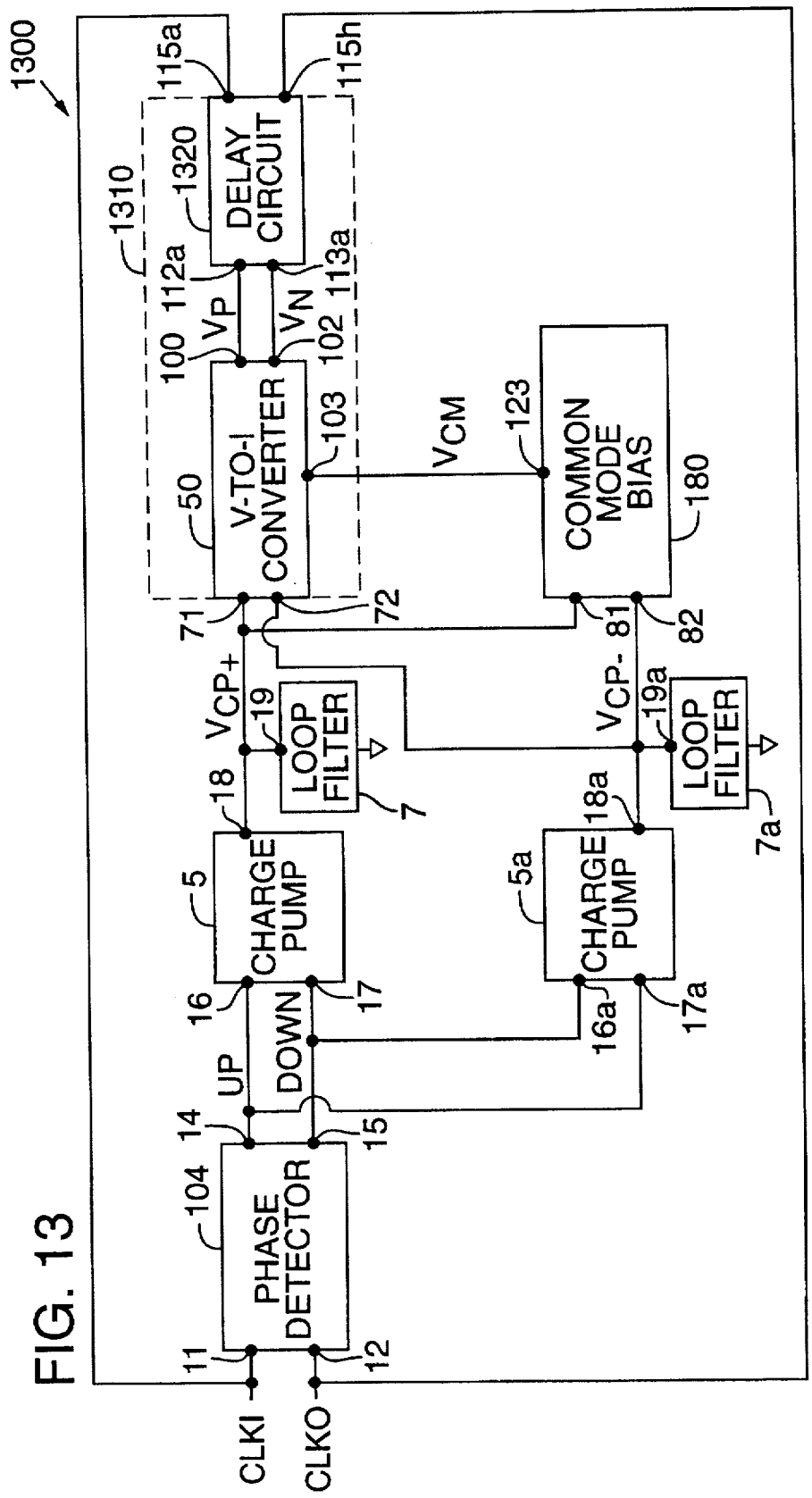
FIG. 13 shows a block diagram of one embodiment of a differential charge pump based delay locked loop 1300 according to the present invention.

FIG. 13 shows a block diagram of one embodiment of a delay locked loop 1300 according to one embodiment of the present invention. Delay locked loop 1300 is substantially the same as phase locked loop 900 except that Delay locked loop 1300 has a voltage-controlled delay circuit 1310 instead of voltage-controlled oscillator 170 as in phase locked loop 900. Voltage-controlled delay circuit 1310 includes voltage-to-current converter 50, which is coupled to delay circuit 1320 instead of ring oscillator 110. The other elements of delay locked loop 1300 are substantially the same as in phase locked loop 900. It is appreciated that delay locked loop 1300 employs a differential scheme as described above for phase locked loop 300, thereby reducing static phase error through cancellation of errors.

Except as noted above, all the elements common to delay locked loop 1300 and phase locked loop 900 are connected and function in substantially the same manner as described above. As described above for phase locked loop 900: phase detector 104 detects the phase difference between clock signals CLKI and CLKO and generates pulses at terminals 14 and 15; charge pumps 5 and 5a control the voltages $V_{CP+}$ and $V_{CP-}$ in response to the pulses generated by phase detector 104; loop filters 7 and 7a stabilize the loop; common mode bias circuit 180 adjusts the common mode voltage to maximize the voltage swing of voltages $V_{CP+}$ and $V_{CP-}$; and voltage-to-current converter 50 generates a current proportional to the difference between voltages $V_{CP+}$ and $V_{CP-}$.

Delay circuit 1320 receives clock signal CLKI at terminal 115a and voltages $V_P$ and $V_N$ generated by voltage-to-current converter 50 at terminals 112a and 113a, respectively. Delay 1320 generates clock signal CLKO at terminal 115h. Delay circuit 1320 aligns the phase of clock signal CLKO with clock signal CLKI by varying the delay experienced by clock signal CLKO in delay circuit 1320 in proportion to the difference between voltages $V_{CP+}$ and $V_{CP-}$.

Figure 14:
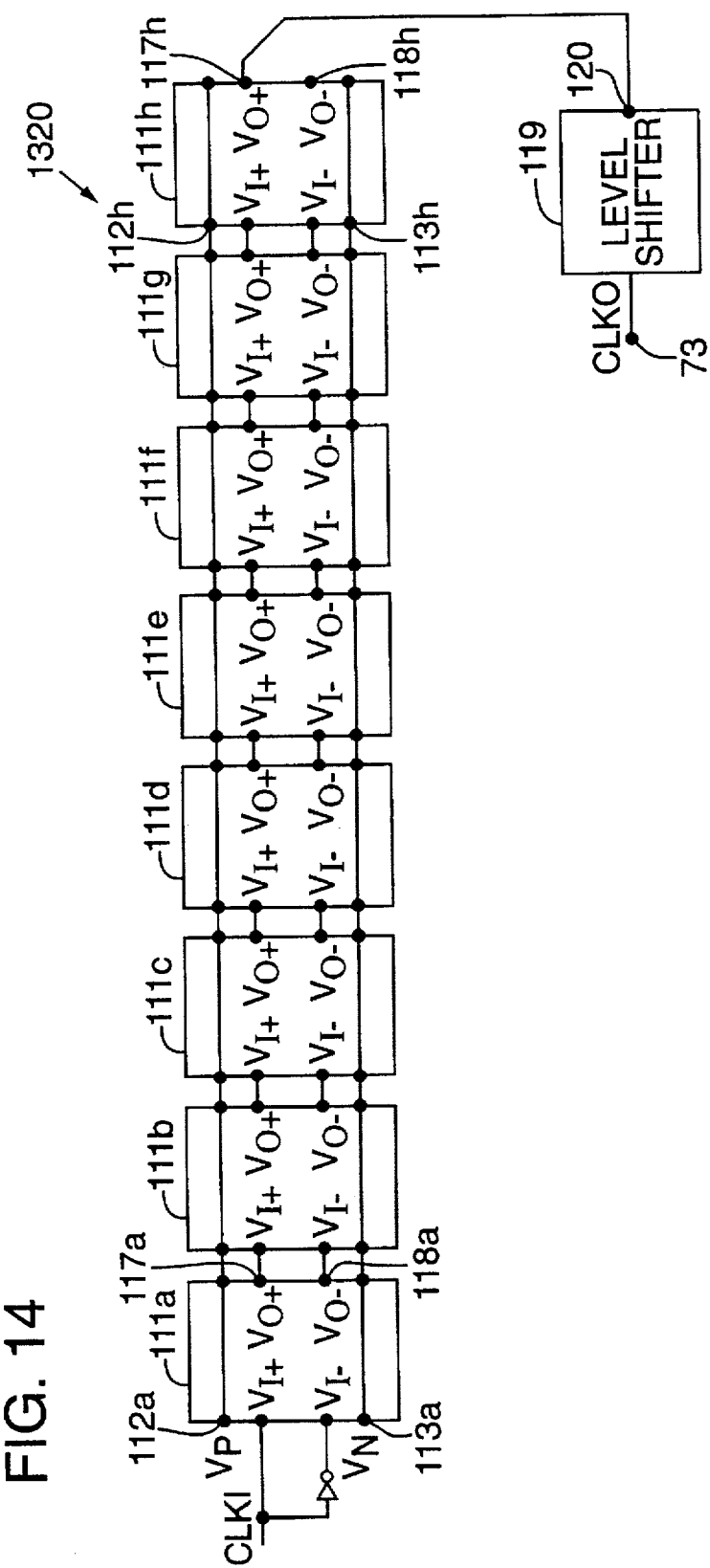
FIG. 14 shows a block diagram of one embodiment of a delay circuit 1320 depicted in FIG. 13.

FIG. 14 shows a block diagram of one embodiment of the delay circuit 1320 depicted in FIG. 13. Delay circuit 1320 is basically ring oscillator 110 (FIG. 10) with the ring "broken" and clock signal CLKI connected to terminal 115a. Clock signal C1KI is inverted and connected to terminal 116a. As a result, each transition of clock signal CLKI propagates through stages 111a–111h, thereby generating clock signal CLKO. The rate at which each transition of clock signal CLKI propagates through delay circuit 1320 is controlled by the speed at each stage transitions from one logic state to the opposite logic state. As stated in the discussion above for FIG. 11, the currents conducted by transistors 51 and 101 of voltage-to-current converter 50 (FIG. 7) control the speed at which each stage 111a–111h transitions. Thus, the voltage difference between voltages $V_{CP+}$ and $V_{CP-}$, controls the speed at which each stage 111a–111h transitions, thereby adjusting the delay through delay circuit 1320 to align clock signal CLKO with clock signal CLKI.

Figure 15:
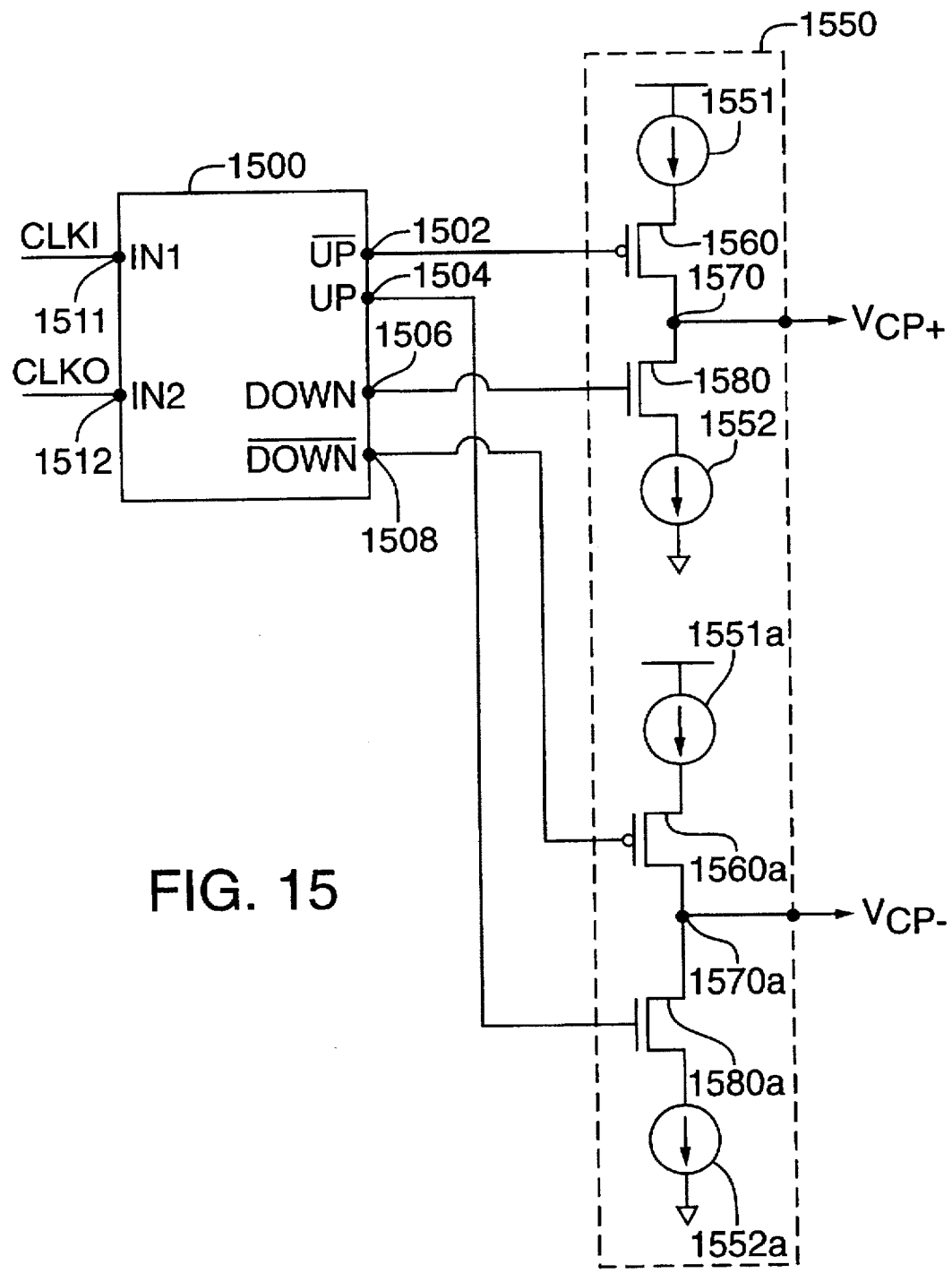
FIG. 15 shows a block diagram of a phase detector 1500 and differential charge pump 1550 according to another embodiment of the present invention.

FIG. 15 shows a block diagram of a phase detector 1500 and differential charge pump 1550 according to another embodiment of the present invention. Phase detector 1500 receives clock signals CLKI and CLKO at terminals 1511 and 1512, respectively. Similar to phase detector 104 (FIG. 3), when clock signal CLKI leads clock signal CLKO, phase detector 1500 generates a pulse having a pulse width proportional to the phase difference at UP terminal 1504. When clock signal CLKI lags clock signal CLKO, phase detector 1500 generates a pulse having a pulse width proportional to the phase difference at DOWN terminal 1506. Phase detector 1500 generates at $\overline{UP}$ terminal 1502 and $\overline{DOWN}$ terminal 1508 signals that are the inverse of the signals generated at UP terminal 1504 and DOWN terminal 1506, respectively.

Differential charge pump 1550 is basically the same as differential charge pump 105 (FIG. 3), except that switches 41, 41a, 43 and 43a (FIG. 5) are implemented as P-channel transistors 1560 and 1560a and N-channel transistors 1580 and 1580a, respectively. The gate of P-channel transistor 1560 is coupled to $\overline{UP}$ terminal 1502. As a result, when clock signal CLKI leads clock signal CLKO, phase detector 1500 generates a "negative" pulse at $\overline{UP}$ terminal 1502, which causes P-channel transistor 1560 to conduct charge to node 1570, thereby increasing voltage $V_{CP+}$. At the same time, phase detector 1500 generates a "positive" pulse at UP terminal 1504, which is coupled to the gate of N-channel transistor 1580a, causing N-channel transistor 1580a to conduct charge from node 1570a, thereby decreasing voltage $V_{CP-}$. Thus, the difference between voltages $V_{CP+}$ and $V_{CP-}$ is increased.

Similarly, when clock signal CLKI lags clock signal CLKO, phase detector 1500 generates a "positive" pulse at DOWN terminal 1506, which is coupled to the gate of N-channel transistor 1580, causing N-channel transistor 1580 to conduct charge away from node 1570. As a result, voltage $V_{CP+}$ is decreased. At the same time, phase detector 1500 generates a "negative" pulse at $\overline{DOWN}$ terminal 1508, which is coupled to the gate of P-channel transistor 1560a, causing P-channel transistor 1560a to conduct charge to node 1570a. As a result, voltage $V_{CP-}$ is increased. Thus, the difference between voltages $V_{CP+}$ and $V_{CP-}$ is decreased.

In this manner, differential charge pump 1550 generates a differential signal proportional to the phase difference between clock signals CLKI and CLKO.

Figure 16:
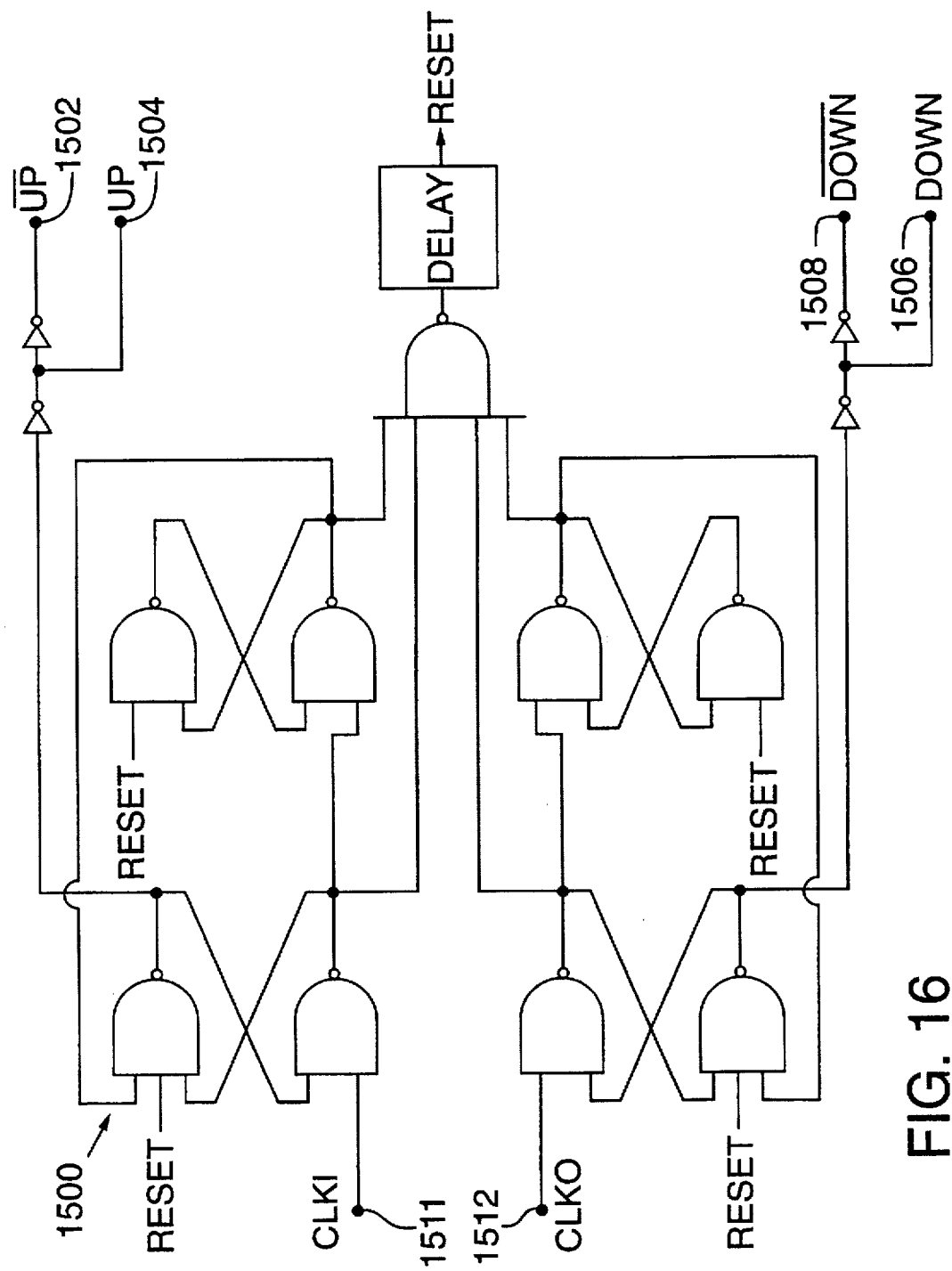
FIG. 16 shows a circuit diagram of one embodiment of phase detector 1500 depicted in FIG. 15.

FIG. 16 shows a circuit diagram of one embodiment of phase detector 1500 depicted in FIG. 15. Phase detector 1500 is different from phase detector 104 (FIG. 4) in that phase detector 1500 uses four flip flops and a NAND gate to generate a RESET signal, rather than two D flip flops and an AND gate to generate the RESET signal as in phase detector 104 (FIG. 4). Phase detector 1500 provides the same function as phase detector 104 (FIG. 4), and in addition, provides the inverses of the UP signal and the DOWN signal at the $\overline{\text{UP}}$ and $\overline{\text{DOWN}}$ terminals 1502 and 1508, respectively.

The foregoing has described the principles and preferred embodiments of the present invention. However, the invention should not be construed as being limited to the particular embodiments described. For example, there are many possible embodiments for the charge pumps, loop filters, phase detector, and voltage-controlled oscillator. Thus the above-described embodiments should be regarded as illustrative rather than restrictive. Variations can be made to those embodiments by workers skilled in the art without departing from the scope of the present invention as defined by the following claims.

I claim:

1. A circuit for aligning a phase of a first signal and a second signal, comprising a differential charge pump circuit having a first input terminal, a second input terminal, a first output terminal and a second output terminal, wherein:

said differential charge pump circuit is capable of generating at said first output terminal and said second output terminal a differential signal in response to a phase difference between said first signal and said second signal; and said differential charge pump circuit is capable of causing a voltage at said first output terminal to increase and a voltage at said second output terminal to decrease when said first input terminal receives an input signal, said voltage decrease being substantially equal in absolute value to said voltage increase.

2. A circuit for aligning a phase of a first signal and a second signal comprising:

a differential charge pump circuit having a first input terminal, a second input terminal, a first output terminal and a second output terminal, wherein said differential charge pump circuit generates at said first output terminal and said second output terminal a differential signal in response to a phase difference between said first signal and said second signal; and a common mode bias circuit coupled to said first output terminal and said second output terminal of said differential charge pump circuit.

3. The circuit recited in claim 2, further comprising a voltage generator generating a reference voltage on an output terminal, said output terminal of said voltage generator coupled to said common mode bias circuit.

4. The circuit recited in claim 3, wherein:

said voltage generator comprises a device substantially identical to a selected device in said circuit for aligning a phase having a performance that limits a voltage range of said differential signal generated by said differential charge pump circuit, said device in said voltage generator substantially identically track the performance of said selected device in said circuit for aligning a phase over temperature, process and power supply changes, and said voltage generator generates said reference voltage at a voltage level to optimize a voltage swing of said differential signal generated by said differential charge pump circuit over temperature, process and power supply changes.

5. The circuit recited in claim 1, further comprising a differential input voltage-controlled oscillator circuit coupled to said first output terminal and said second output terminal of said differential charge pump circuit, wherein said differential input voltage-controlled oscillator circuit is capable of generating an output signal having a frequency proportional to said differential signal generated by said differential charge pump circuit, said output signal of said voltage-controlled oscillator being said second signal.

6. A circuit for aligning a phase of a first signal and a second signal comprising:

a differential charge pump circuit having a first input terminal, a second input terminal, a first output terminal and a second output terminal, wherein said differential charge pump circuit generates at said first output terminal and said second output terminal a differential signal in response to a phase difference between said first signal and said second signal; and a differential input voltage-controlled oscillator circuit coupled to said first output terminal and said second output terminal of said differential charge pump circuit, wherein:

said differential input voltage-controlled oscillator circuit generates an output signal having a frequency proportional to said differential signal generated by said differential charge pump circuit, said output signal of said voltage-controlled oscillator being said second signal; and said differential input voltage-controlled oscillator further comprises a differential input voltage-to-current converter for providing an output current proportional to said differential signal generated by said differential charge pump circuit.

7. The circuit recited in claim 1, further comprising a phase detector having a first input terminal and a second input terminal, said first input terminal and said second input terminal of said phase detector for receiving said first signal and said second signal, respectively, wherein:

said phase detector is capable of generating an output signal in response to a phase difference between said first signal and said second signal, and said differential charge pump circuit is capable of generating said differential signal in response to said output signal of said phase detector.

8. The circuit recited in claim 7, wherein:

said output signal of said phase detector includes a pulse having a pulse width that is a function of a magnitude of said phase difference, and said phase detector is capable of generating said pulse at a first output terminal of said phase detector when said first signal leads said second signal and generates said pulse at a second output terminal of said phase detector when said first signal lags said second signal.

9. A circuit for aligning a phase of a first signal and a second signal comprising:

a differential charge pump circuit having a first input terminal, a second input terminal, a first output terminal and a second output terminal, wherein said differential charge pump circuit generates at said first output terminal and said second output terminal a differential signal in response to a phase difference between said first signal and said second signal; and a phase detector having a first input terminal and a second input terminal, said first input terminal and said second input terminal of said phase detector for receiving said first signal and said second signal, respectively, wherein:

said phase detector generates an output signal in response to a phase difference between said first signal and said second signal;

said differential charge pump circuit generates said differential signal in response to said output signal of said phase detector;

said output signal of said phase detector includes a pulse having a pulse width that is a function of a magnitude of said phase difference, said phase detector generating said pulse on a first output terminal of said phase detector when said first signal leads said second signal and generates said pulse on a second output terminal of said phase detector when said first signal lags said second signal; and said phase detector comprises:

a first D flip flop having a RESET lead, an input lead and an output lead, said input lead of said first D flip flop coupled to said first input terminal of said phase detector;

a second D flip flop having a RESET lead, an input lead and an output lead, said input lead of said second D flip flop coupled to said second input terminal of said phase detector;

an AND gate having a first input lead, a second input lead, and an output lead, said first input lead of said AND gate coupled to said output lead of said first D flip flop, said second input lead of said AND gate coupled to said output lead of said second D flip flop; and a delay means having an input lead coupled to said output lead of said AND gate and an output lead coupled to said RESET leads of said first D flip flop and said second D flip flop.

10. The circuit of claim 1, further comprising:

a first loop filter coupled to said first output terminal of said differential charge pump circuit; and a second loop filter coupled to said second output terminal of said differential charge pump circuit.

11. The circuit recited in claim 1, wherein said differential charge pump circuit comprises a first charging current source and a first discharging current source, said first charging current source conducting charge to said first output terminal of said differential charge pump circuit, and said first discharging current source conducting charge from said first output terminal of said differential charge pump circuit.

12. The circuit recited in claim 11, wherein said differential charge pump circuit comprises a second charging current source and a second discharging current source, said second charging current source conducting charge to said second output terminal of said differential charge pump circuit, and said second discharging current source conducting charge from said second output terminal of said differential charge pump circuit.

13. The circuit recited in claim 6, wherein said differential input voltage-controlled oscillator further comprises a ring oscillator coupled to said differential input voltage-to-current converter, said ring oscillator generating said output signal of said differential input voltage-controlled oscillator having a frequency proportional to said output current provided by said differential input voltage-to-current converter.

14. A circuit for aligning a phase of a first signal and a second signal comprising:

a differential charge pump circuit having a first input terminal, a second input terminal, a first output terminal and a second output terminal, wherein said differential charge pump circuit generates at said first output terminal and said second output terminal a differential signal in response to a phase difference between said first signal and said second signal; and a phase detector having a first input terminal and a second input terminal, said first input terminal and said second input terminal of said phase detector for receiving said first signal and said second signal, respectively, wherein:

said phase detector generates an output signal in response to a phase difference between said first signal and said second signal;

said differential charge pump circuit generates said differential signal in response to said output signal of said phase detector;

said output signal of said phase detector includes a pulse having a pulse width that is a function of a magnitude of said phase difference, said phase detector generating said pulse on a first output terminal of said phase detector when said first signal leads said second signal and generates said pulse on a second output terminal of said phase detector when said first signal lags said second signal; and said phase detector generates on a third output terminal a signal that is substantially equal to an inverse of a signal generated on said first output terminal of said phase detector, and generates on a fourth output terminal a signal that is substantially equal to an inverse of a signal generated on said second output terminal of said phase detector.

15. The circuit recited in claim 14, wherein:

said differential charge pump circuit further comprises a first P-channel transistor having its gate coupled to said third output terminal of said phase detector and a first N-channel transistor having its gate coupled to said second output terminal of said phase detector, said first P-channel transistor conducting charge to said first output terminal of said differential charge pump circuit, and said first N-channel transistor conducting charge from said first output terminal of said differential charge pump circuit, and said differential charge pump circuit further comprises a second P-channel transistor having its gate coupled to said fourth output terminal of said phase detector and a second N-channel transistor having its gate coupled to said first output terminal of said phase detector, said P-channel transistor conducting charge to said second output terminal of said differential charge pump circuit, and said second N-channel transistor conducting charge from said second output terminal of said differential charge pump circuit.

16. A circuit for aligning a phase of a first signal and a second signal, said circuit comprising:

a phase detector having a first input terminal for receiving said first signal, a second input terminal for receiving said second signal, a first output terminal and a second output terminal, said phase detector receiving said first signal at said first input terminal and receiving said second signal at said second input terminal, wherein said phase detector generates a first output signal on said first output terminal when said first signal leads said second signal and a second output signal on said second output terminal when said first signal lags said second signal;

a differential charge pump circuit having a first output terminal and a second output terminal, wherein said differential charge pump circuit generates at said first output terminal and said second output terminal a differential output signal in response to said first and second output signals of said phase detector;

a differential input voltage-controlled oscillator circuit for generating an output signal in response to said differential output signal from said differential charge pump circuit, said output signal of said differential input voltage-controlled oscillator circuit being said second signal;

a first loop filter coupled to said first output terminal of said differential charge pump circuit;

a second loop filter coupled to said second output terminal of said differential charge pump circuit; and a common mode bias circuit having a first lead coupled to said first output terminal of said differential charge pump circuit and a second lead coupled to said second output terminal of said differential charge pump circuit.

17. A circuit comprising:

means for generating a differential signal at a first output terminal and a second output terminal in response to a phase difference between two oscillating signals;

means for generating an oscillating signal in response to said differential signal, said means for generating an oscillating signal coupled to said first output terminal and said second output terminal of said means for generating a differential signal; and means for varying a common mode voltage of said differential signal, said means for varying coupled to said first and second output terminals of said means for generating a differential signal.

18. A method for generating an output signal synchronized in phase with a reference signal, said method comprising the steps of:

generating said output signal;

detecting a phase difference between said reference signal and said output signal;

generating a differential signal in response to said phase difference;

maintaining a common mode voltage of said differential signal to be substantially equal to a reference voltage; and altering the frequency of said output signal in response to said differential signal.

19. A circuit for aligning a phase of a first signal and a second signal comprising:

a differential charge pump circuit having a first input terminal, a second input terminal, a first output terminal and a second output terminal, wherein said differential charge pump circuit generates at said first output terminal and said second output terminal a differential signal in response to a phase difference between said first signal and said second signal; and a voltage-controlled delay circuit coupled to said first output terminal and said second output terminal of said differential charge pump circuit, wherein said voltage-controlled delay circuit generates said second signal.

20. The circuit recited in claim 19 wherein, said voltage-controlled delay circuit further comprises a differential input voltage-to-current converter.

21. The circuit recited in claim 19 further comprising a phase detector having a first input terminal for receiving said first signal and a second input terminal for receiving said second signal, wherein said phase detector generates an output signal in response to a phase difference between said first signal and said second signal.

22. The circuit recited in claim 21, wherein said output signal of said phase detector includes a pulse having a pulse width that is a function of a magnitude of said phase difference, and wherein said phase detector generates said pulse on a first output terminal of said phase detector when said first signal leads said second signal and generates said pulse on a second output terminal of said phase detector when said first signal lags said second signal.

23. The circuit recited in claim 19 further comprising a common mode bias circuit coupled to said first output terminal and said second output terminal of said differential charge pump circuit.

24. A circuit having a first input terminal and a second input terminal, said circuit comprising:

a first D flip flop having a RESET lead, an input lead and an output lead, said input lead of said first D flip flop coupled to said first input terminal of said circuit;

a second D flip flop having a RESET lead, an input lead and an output lead, said input lead of said second D flip flop coupled to said second input terminal of said circuit;

an AND gate having a first input lead, a second input lead, and an output lead, said first input lead of said AND gate coupled to said output lead of said first D flip flop, said second input lead of said AND gate coupled to said output lead of said second D flip flop; and a delay means having an input lead coupled to said output lead of said AND gate and an output lead coupled to said RESET leads of said first D flip flop and said second D flip flop, wherein said circuit generates an output signal in response to a phase difference between a first signal detected on said first input terminal and a second signal detected on said second input terminal.

* * * * *